(12) United States Patent
Abe et al.

(10) Patent No.: US 9,544,694 B2
(45) Date of Patent: Jan. 10, 2017

(54) PIEZOELECTRIC ELEMENT, PIEZOELECTRIC VIBRATION MODULE, AND METHODS OF MANUFACTURING THE SAME

(75) Inventors: Yoshiyuki Abe, Sendai (JP); Takeshi Mizuno, Sendai (JP); Hiroshi Shima, Sendai (JP); Masao Yamaguchi, Sendai (JP); Noriaki Ikezawa, Sendai (JP); Katsunori Kumasaka, Sendai (JP)

(73) Assignee: NEC TOKIN CORPORATION, Sendai-shi, Miyagi (JP)

( * ) Notice: Subject to any disclaimer, the term of this patent is extended or adjusted under 35 U.S.C. 154(b) by 166 days.

(21) Appl. No.: 14/390,997

(22) PCT Filed: Jul. 13, 2012

(86) PCT No.: PCT/JP2012/067971
§ 371 (c)(1),
(2), (4) Date: Jan. 9, 2015

(87) PCT Pub. No.: WO2013/150667
PCT Pub. Date: Oct. 10, 2013

(65) Prior Publication Data
US 2015/0163598 A1    Jun. 11, 2015

(30) Foreign Application Priority Data

Apr. 5, 2012    (JP) ................ 2012-086278

(51) Int. Cl.
| | | |
|---|---|---|
| *H04R 3/00* | (2006.01) | |
| *H04R 17/00* | (2006.01) | |
| *H04R 11/00* | (2006.01) | |
| *H04R 31/00* | (2006.01) | |
| *H01L 41/047* | (2006.01) | |
| *H01L 41/053* | (2006.01) | |
| *H01L 41/083* | (2006.01) | |
| *H01L 41/09* | (2006.01) | |
| *H01L 41/25* | (2013.01) | |
| *H01L 41/27* | (2013.01) | |

(52) U.S. Cl.
CPC ........... *H04R 17/00* (2013.01); *H01L 41/0475* (2013.01); *H01L 41/053* (2013.01);
(Continued)

(58) Field of Classification Search
CPC ........ H04R 17/00; B06B 1/0603; Y10T 29/42
(Continued)

(56) References Cited

U.S. PATENT DOCUMENTS

2002/0036954 A1* 3/2002 Kani .................. G01S 7/52004
                                                            367/163
2005/0226453 A1* 10/2005 Kamo .................. H04R 1/1016
                                                            381/384

(Continued)

FOREIGN PATENT DOCUMENTS

JP    59193497 A    11/1984
JP    2007028469 A    2/2007
(Continued)

OTHER PUBLICATIONS

International Search Report (ISR) dated Oct. 2, 2012 issued in International Application No. PCT/JP2012/067971.
(Continued)

*Primary Examiner* — George Monikang
(74) *Attorney, Agent, or Firm* — Holtz, Holtz & Volek PC

(57) ABSTRACT

A piezoelectric vibration module includes a piezoelectric element, a wiring member connected to the piezoelectric element and drawn out to the outside, and an elastic plate bonded to one surface of the piezoelectric element, wherein the elastic plate is made of a silicone rubber.

43 Claims, 25 Drawing Sheets

(52) U.S. Cl.
CPC ........ *H01L 41/083* (2013.01); *H01L 41/0926* (2013.01); *H01L 41/0933* (2013.01); *H04R 31/006* (2013.01); *H01L 41/25* (2013.01); *H01L 41/27* (2013.01); *Y10T 29/42* (2015.01); *Y10T 29/4913* (2015.01)

(58) Field of Classification Search
USPC .................................. 381/114, 111, 162, 190
See application file for complete search history.

(56) References Cited

U.S. PATENT DOCUMENTS

| | | | | |
|---|---|---|---|---|
| 2011/0116664 A1* | 5/2011 | Fujioka | ................... | H01L 41/12 381/190 |
| 2012/0090449 A1* | 4/2012 | Lee | ........................ | G10H 3/143 84/731 |

FOREIGN PATENT DOCUMENTS

| | | | |
|---|---|---|---|
| JP | 2007221532 A | 8/2007 |
| JP | 2007228610 A | 9/2007 |
| JP | 2008005056 A | 1/2008 |
| JP | 2008022371 A | 1/2008 |
| JP | 2010117867 A | 5/2010 |
| JP | 2010177867 A | 8/2010 |
| JP | 2010283141 A | 12/2010 |

OTHER PUBLICATIONS

Japanese Office Action (and English translation thereof) dated Feb. 10, 2016, issued in counterpart Japanese Application No. 2014-508995.

* cited by examiner (a)

Temperature Characteristics of Displacement (b)

Temperature Characteristics of Displacement Change Rate

PIEZOELECTRIC ELEMENT, PIEZOELECTRIC VIBRATION MODULE, AND METHODS OF MANUFACTURING THE SAME

TECHNICAL FIELD

This invention relates to a piezoelectric vibration module incorporating a piezoelectric element and, specifically, relates to a panel-acoustic piezoelectric vibration module for use in a mobile terminal, a touch panel in general, a game controller, a game machine, or the like.

BACKGROUND ART

A piezoelectric acoustic module such as a piezoelectric speaker for use in a mobile telephone or the like is intended for sound amplification for audio signals and, therefore, a piezoelectric element vibrates with a large amplitude and thus is conventionally supported by a material with high mechanical compliance. A problem of this structure is that while molding is carried out for ensuring water-tightness, when molded, the temperature characteristics are poor. In particular, if molding is carried out using a material with high flexibility such as polyurethane, the flexible material hardens at a low temperature so that the resonance frequency in the form of a molded body increases, while, the flexible material softens at a high temperature so that the resonance frequency in the form of a molded body decreases. Consequently, the temperature dependence of the resonance frequency is high, resulting in difficulty for practical use.

Patent Document 1 discloses an acoustic vibration generating element with improved temperature dependence, wherein a silicone rubber solution is poured into a brass mold over the entire surfaces of a bimorph element and then a curing treatment is carried out to cover the bimorph element with a rubber coating film having a thickness of 2 mm on the two surfaces of the bimorph element in its thickness direction and a thickness of 1 mm in its width direction.

PRIOR ART DOCUMENT

Patent Document

Patent Document 1: JP-A-2007-228610

SUMMARY OF THE INVENTION

Problem to be Solved by the Invention

In Patent Document 1, the bimorph element is molded with the silicone rubber in order to improve the impact resistance and the temperature dependence. However, in the case where the silicone rubber solution is cured by heating, the polarization of the bimorph element is lost due to a heat curing temperature of 70 to 250° C. so that the bimorph element does not function.

On the other hand, in Patent Document 1, if, after carrying out a polarization treatment of the bimorph element, a moisture-curing type silicone rubber solution is used as the silicone rubber solution that is poured into the brass mold, it takes too much time until the silicone rubber solution is cured.

Further, in Patent Document 1, for connecting electrode layers of a bimorph element having a laminated structure, a pattern having a plurality of mutually insulated electrode portions should be formed for each of the electrode layers. Accordingly, in order to drive the bimorph element, lines from a wiring cable should be connected to a plurality of portions by brazing, such as soldering, or the like for conduction to the respective electrode portions. This operation is complicated. If molded in the state where this wiring is provided, vibration of the bimorph element is restricted so that its characteristics are adversely affected.

Therefore, it is a technical object of this invention to provide a piezoelectric element having a wiring electrode pattern structure which facilitates electrical connection.

It is another technical object of this invention to provide a piezoelectric vibration module having water-tightness of a piezoelectric element, hardly affected by a change in temperature, and having excellent displacement propagation characteristics, and a piezoelectric element for use therein.

It is still another technical object of this invention to provide a piezoelectric vibration module which facilitates surface mounting, and a piezoelectric element for use therein.

It is a further technical object of this invention to provide a piezoelectric vibration module having a sound pressure adjusting means that can increase the sound pressure and that can avoid resonance or vibration with a mounting member, and a piezoelectric element for use therein.

Means for Solving the Problem

According to a first aspect of this invention, it is able to obtain a piezoelectric vibration module comprising a piezoelectric element, a wiring member connected to the piezoelectric element and drawn out to the outside, and an elastic plate attached to one surface of the piezoelectric element, wherein the elastic plate is made of a silicone rubber.

According to a second aspect of this invention, it is able to obtain an electroacoustic transducer wherein the elastic plate of the piezoelectric vibration module is bonded to a diaphragm.

According to a third aspect of this invention, it is able to obtain a piezoelectric element comprising a laminate in which piezoelectric body layers and electrode layers are alternately laminated, and a first and a second side electrode provided on both end faces or both side surfaces in a second direction crossing a first direction being a lamination direction of the laminate, wherein each electrode layer comprises a first electrode portion and a second electrode portion electrically separated from the first electrode portion, wherein the first side electrode comprises a first external electrode and a second external electrode which are disposed side by side in a third direction crossing the first and second directions, wherein the first electrode portion of each electrode layer is connected to the first external electrode, wherein one end, in the second direction, of the second electrode portion of each electrode layer is connected to the second external electrode, wherein the other end, in the second direction, of the second electrode portion of each of the electrode layers at both ends in the first direction is connected to the second side electrode, and wherein the electrode layers and the first and second side electrodes are electrically connected so that a driving voltage can be applied between the first electrode portions and the second electrode portions using the second electrode portions of the electrode layers at both ends in the first direction as driving external electrodes and the first electrode portions of the intermediate electrode layers between both ends in the first direction as driving internal electrodes.

According to a fourth aspect of this invention, it is able to obtain a method of manufacturing a piezoelectric element, comprising:

a step of preparing a first piezoelectric body having three mutually insulated electrodes;

a step of preparing a second piezoelectric body having two mutually insulated electrodes;

a step of preparing at least one third piezoelectric body having three mutually insulated electrodes;

a step of forming a laminate in which the third piezoelectric body is laminated between the first and second piezoelectric bodies, and the three electrodes of the first piezoelectric body and the three electrodes of the third piezoelectric body are electrically connected to each other and two of the three electrodes of each of the first and third piezoelectric bodies and the two electrodes of the second piezoelectric body are electrically connected to each other;

a step of polarizing the first and second piezoelectric bodies using the three electrodes of the first piezoelectric body;

a step of electrically connecting one and another one of the three electrodes of the first piezoelectric body to each other and forming two mutually electrically insulated element electrodes; and a step of connecting a terminal having conductor patterns which are electrically connected to the two element electrodes of the first piezoelectric body.

According to a fifth aspect of this invention, it is able to obtain a method of manufacturing a piezoelectric vibration module, comprising connecting a flexible wiring board to the element electrodes of the piezoelectric element manufactured by the method of manufacturing a piezoelectric element according to claim 13 and attaching a vibration plate to a surface other than a surface where the element electrodes are formed.

According to a sixth aspect of this invention, it is able to obtain a method of manufacturing an electroacoustic transducer, comprising, in addition to the method of manufacturing the piezoelectric vibration module, covering the piezoelectric element including a connecting portion of the flexible wiring board with a housing member.

According to a seventh aspect of this invention, it is able to obtain a piezoelectric vibration module comprising a piezoelectric element, a wiring member connected to the piezoelectric element and drawn out to the outside, an elastic plate attached to one surface of the piezoelectric element, and a housing member provided so as to cover the piezoelectric element and a connecting portion, with the piezoelectric element, of the wiring member.

In the piezoelectric vibration module according to the seventh aspect of this invention, it is desirable to have an electrode lead-out portion provided on the other surface, facing the one surface to which the elastic plate is attached, of the piezoelectric element, and is desirable that the wiring member is one of a flexible wiring board and an elastic conductive member conductively connected to the electrode lead-out portion.

In the piezoelectric vibration module according to the seventh aspect of this invention, it is preferable that the wiring member is the flexible wiring board and that the flexible wiring board passes through the housing member in a direction along the one surface or the other surface of the piezoelectric element from the electrode lead-out portion and is drawn out in a longitudinal direction of the piezoelectric element. Further, it is desirable that the wiring member is the conductive member and that the conductive member passes through the housing member and protrudes in a direction crossing the other surface of the piezoelectric element from the electrode lead-out portion.

According to an eighth aspect of this invention, it is able to obtain an electroacoustic transducer comprising the piezoelectric vibration module, a drive circuit board, and a housing, wherein the housing holds the conductive member in pressure contact with the drive circuit board through the piezoelectric vibration module.

According to a ninth aspect of this invention, it is able to obtain a mounting method of placing the piezoelectric vibration module in a housing and mounting it, wherein the wiring member is the conductive member passing through the housing member and protruding to the outside and wherein the housing causes a protruding end of the conductive member of the piezoelectric vibration module to be in pressure contact with a drive circuit board.

According to a tenth aspect of this invention, it is able to obtain a piezoelectric element comprising a laminate in which a plurality of piezoelectric element portions are laminated in a first direction, wherein the piezoelectric element portions have piezoelectric body layers, surface electrode layers formed on the piezoelectric body layers in a second direction crossing the first direction, and first and second lead-out electrodes formed at ends in the second direction of the piezoelectric body layers and connected to the surface electrode layers, wherein the first and second lead-out electrodes are drawn out from the surface electrode layers to the ends of the piezoelectric body layers corresponding to lamination positions of the piezoelectric element portions in the laminate.

According to an eleventh aspect of this invention, it is able to obtain a method of manufacturing a piezoelectric element, comprising:

a step of preparing a plurality of piezoelectric element portions having piezoelectric body layers, surface electrode layers, and mutually different end electrode layers formed at ends; and a step of forming a laminate by laminating the plurality of piezoelectric element portions in a first direction in order, wherein, in the step of forming a laminate, the end electrode layers of the piezoelectric element portions are laminated so as to be drawn out to the end sides corresponding to lamination positions of the piezoelectric element portions in the laminate.

According to a twelfth aspect of this invention, it is able to obtain a method of manufacturing a piezoelectric vibration module, comprising:

in addition to any one of the above-mentioned methods of manufacturing the piezoelectric element, a step of connecting a wiring member, for leading out to the outside, to the piezoelectric element;

a step of attaching an elastic plate to one surface of the piezoelectric element; and a step of providing a housing member covering the piezoelectric element and a connecting portion, with the piezoelectric element, of the wiring member.

Effect of the Invention

According to this invention, since a piezoelectric element is covered with an elastic plate and a housing member each made of a silicone rubber, it is possible to provide a piezoelectric vibration module that can not only ensure the impact resistance but also stabilize the temperature characteristics and that can improve the vibration displacement and efficiently propagate the vibration by specifying the hardness of the silicone rubber.

Further, according to this invention, by concentrating electrode patterns of lead-out terminals of a piezoelectric element in one plane, it is possible to provide a piezoelectric vibration module that can simplify a wiring member by the use of an FPC board or the like.

Further, according to this invention, using an elastic conductive member as a wiring member, it is possible to provide a piezoelectric vibration module that facilitates mounting.

Further, according to this invention, by providing a sound pressure adjusting means, it is possible to provide a piezoelectric vibration module that can adjust the sound pressure, such as, increasing the sound pressure, adjusting the sound pressure distribution, and flattening the frequency characteristics.

MODE FOR CARRYING OUT THE INVENTION

Figure 1:
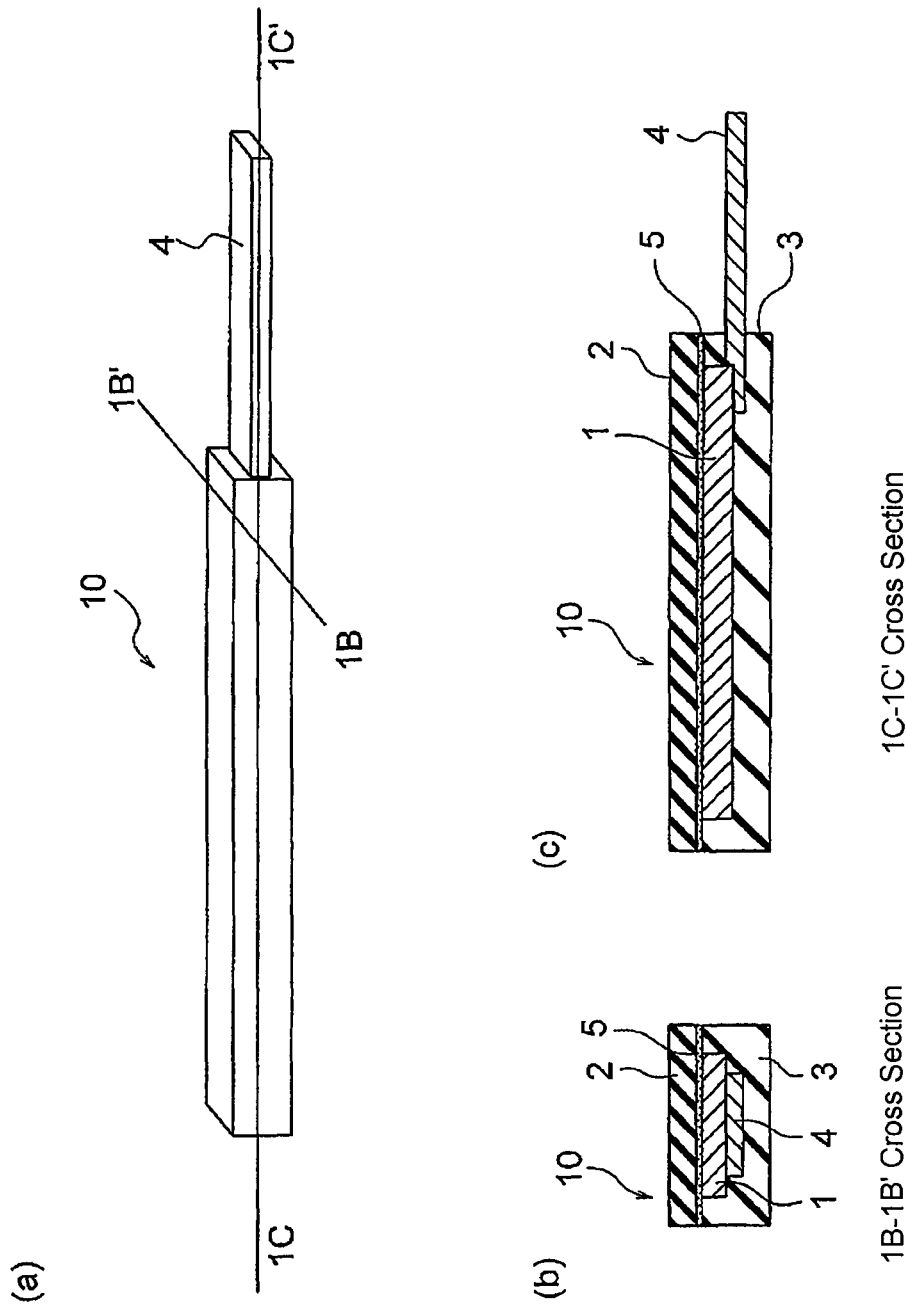
FIG. 1 includes (a) which is a perspective view showing a piezoelectric vibration module according to an embodiment of this invention, (b) which is a cross-sectional view taken along line 1B-1B' of (a), and (c) which is a cross-sectional view taken along line 1C-1C' of (a).

Hereinbelow, embodiments of this invention will be described with reference to the drawings.

FIG. 1(a) is a perspective view showing a piezoelectric vibration module according to a first embodiment of this invention, FIG. 1(b) is a cross-sectional view taken along line 1B-1B' of FIG. 1(a), and FIG. 1(c) is a cross-sectional view taken along line 1C-1C' of FIG. 1(a). FIG. 2 is a partial perspective view showing a main part of the piezoelectric vibration module of FIG. 1(a), FIG. 1(b), and FIG. 1(c). In FIG. 2, a housing member 3 is removed.

As shown in FIG. 1(a), FIG. 1(b), and FIG. 1(c), a piezoelectric vibration module 10 comprises a rectangular piezoelectric element 1, a flexible wiring (FPC) board as a lead-out wiring member 4 connected to one surface of the piezoelectric element 1 (hereinafter, the flexible wiring (FPC) board will be denoted by the same reference symbol 4), an elastic plate 2 bonded to the other surface of the piezoelectric element 1 through an adhesive 5, and a housing member 3 covering the piezoelectric element jointly with the elastic plate 2.

Figure 2:
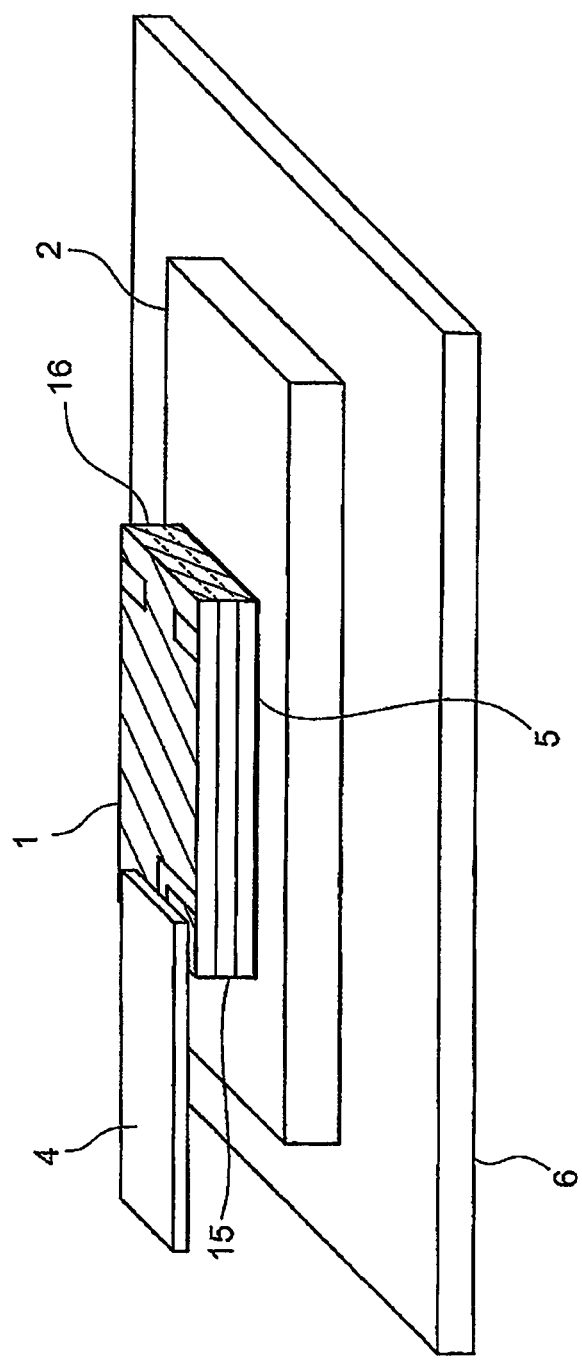
FIG. 2 is a partial perspective view showing a main part of the piezoelectric vibration module of FIG. 1(a), FIG. 1(b), and FIG. 1(c).
Figure 3:
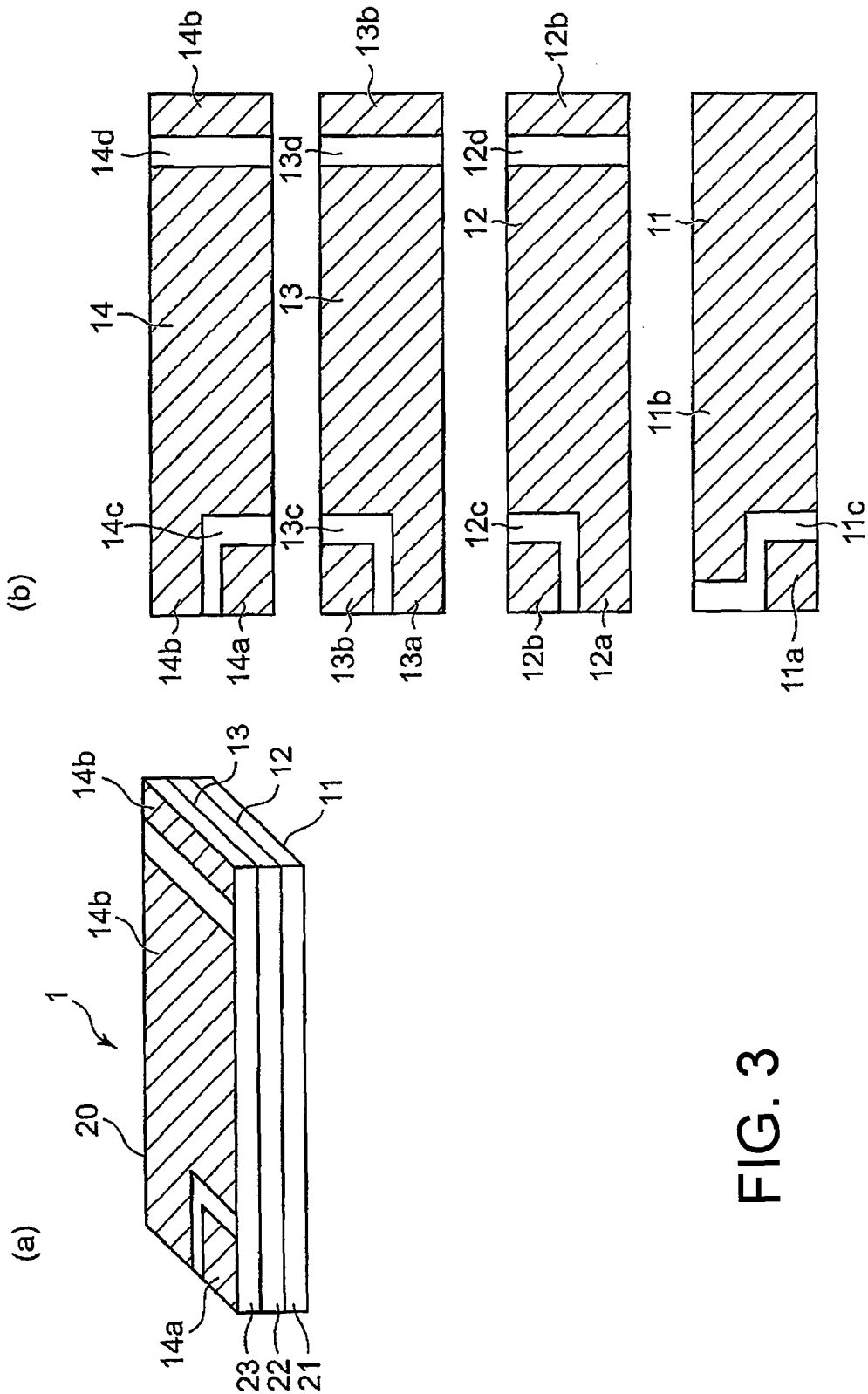
FIG. 3 includes (a) which is a diagram for explaining a manufacturing process of a piezoelectric element for use in the piezoelectric vibration module according to the embodiment of this invention and is a perspective view of a laminate, and (b) which is a diagram for explaining the manufacturing process of the piezoelectric element for use in the piezoelectric vibration module according to the embodiment of this invention and is a plan view showing electrode patterns of electrode layers.
Figure 4:
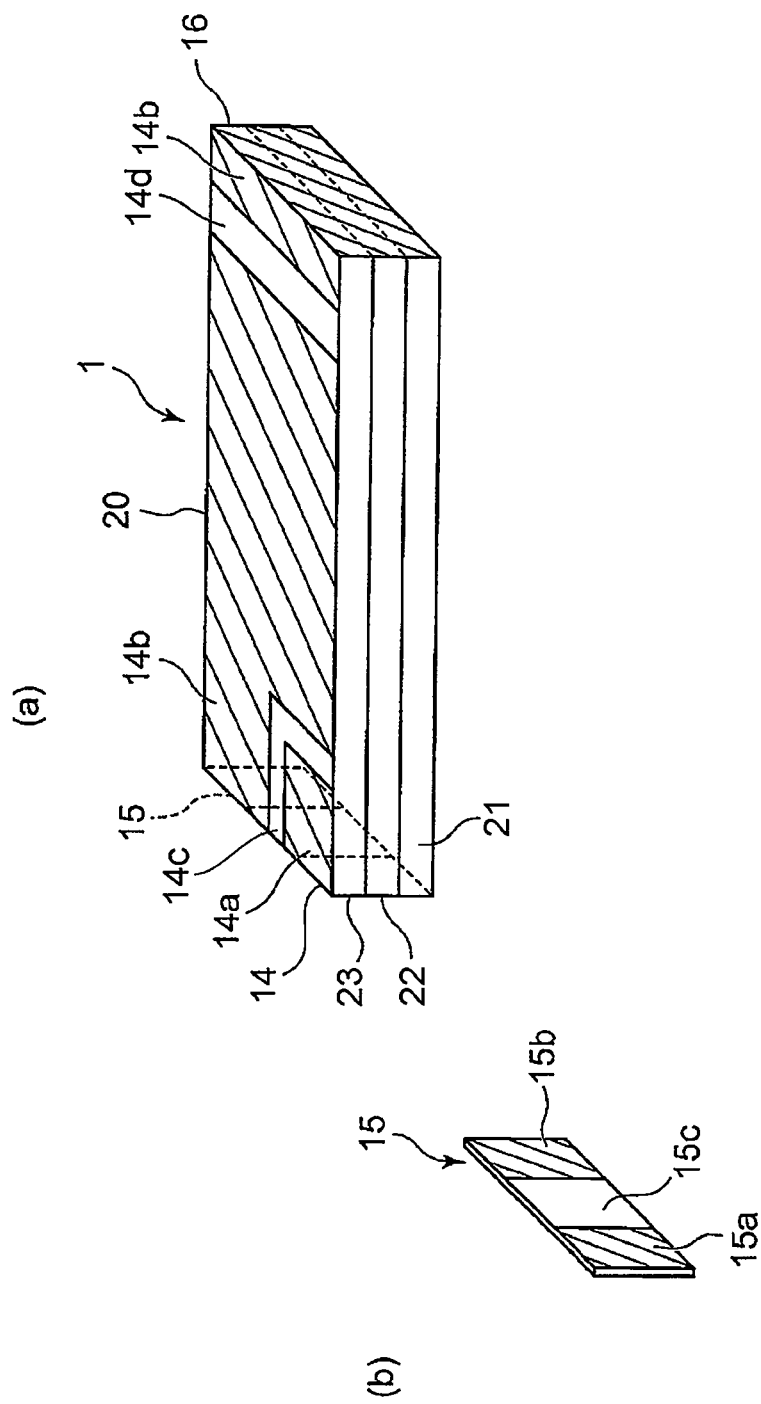
FIG. 4 includes (a) which is a perspective view showing a process of forming side electrodes at both ends of the laminate for use in the piezoelectric vibration module according to the embodiment of this invention and (b) which is a perspective view showing the process of forming the side electrodes at both ends of the laminate for use in the piezoelectric vibration module according to the embodiment of this invention.

As shown in FIG. 2 and FIG. 3, the piezoelectric element 1 is formed by alternately laminating piezoelectric body layers 21, 22, and 23 each in the form of a rectangular piezoelectric ceramic plate and planar (surface) electrode layers 11, 12, 13, and 14 each in the form of a conductor film and further by forming first and second side electrodes 15 and 16 respectively on both end faces in a second direction crossing a lamination direction (first direction).

In the first embodiment of this invention, the piezoelectric ceramic plates of a PZT-based material are used as the piezoelectric body layers 21, 22, and 23. However, naturally, any material may be used as long as it is a material having a piezoelectric effect.

The elastic plate 2 is made of a silicone rubber having a durometer hardness defined by JIS K 623 of 30 to 130 in order to achieve an improvement in temperature stability characteristics and an improvement in vibration displacement and having a thickness of 0.1 to 0.9 mm in order to achieve both an increase in vibration displacement and the drop impact resistance.

The flexible wiring board (FPC board) 4 as the wiring member 4 is provided on the surface, near its end, of the piezoelectric element 1.

As best shown in FIG. 7(a) which will be described later in detail, the FPC board 4 is configured such that conductor patterns 4a and 4b are formed in parallel to each other on both sides of a longitudinal direction of one surface (back surface in the figure) of a flexible base member 4c.

Referring again to FIG. 2, the elastic plate 2 is bonded to the surface, on the side opposite to and facing the surface on which the FPC board 4 is provided, of the piezoelectric element 1 through the adhesive 5 such as a cold-setting adhesive or silicone-based double-sided tape. Preferably, the hardness of the adhesive 5 is equal to or less than that of the elastic plate 2.

In the illustrated example, the elastic plate 2 is used by being bonded to a diaphragm 6 of a touch panel. However, it can also be used as a speaker of a smartphone or the like or it can also generate low-frequency vibration of a vibrator or the like other than in the audible range.

Next, referring to FIGS. 3 to 7, manufacturing processes of the piezoelectric vibration module according to the embodiment of this invention will be described.

FIG. 3(a) is a diagram showing a manufacturing process of the piezoelectric element for use in the piezoelectric vibration module according to the embodiment of this invention and is a perspective view of a laminate forming the piezoelectric element, and FIG. 3(b) is a diagram showing the manufacturing process of the piezoelectric element for use in the piezoelectric vibration module according to the embodiment of this invention and shows electrode patterns of the planar electrode layers of the laminate.

As shown in FIG. 3(a), on the bottom planar electrode layer 11 at one end in the first direction, the piezoelectric body layer 21, the first intermediate planar electrode layer 12, the piezoelectric body layer 22, the second intermediate planar electrode layer 13, the piezoelectric body layer 23, and the uppermost planar electrode layer 14 at the other end in the first direction are laminated in this order. Each piezoelectric body layer jointly with the planar electrode layers located on its both surfaces forms a single piezoelectric vibrating portion.

The bottom planar electrode layer 11 is formed by electrically separating a rectangular electrode film into pieces by an insulating portion 11c. The insulating portion 11c extends downward from an upper side on one end side along an end side, then extends rightward from the middle of the end side, and then is bent downward to reach a bottom side. By this insulating portion 11c, a corner portion on the lower side is left rectangular and forms a first electrode portion 11a. A second electrode portion 11b is formed by the remaining electrode film which is electrically separated from the first electrode portion 11a by the insulating portion 11c. The second electrode portion 11b is added with a connection electrode film 11d (FIG. 6b) when driven so as to have substantially the same structure as an uppermost planar electrode layer 14 which will be described hereinbelow, wherein a second electrode portion 14b and a second-electrode right-side end portion 14b are connected to a connection electrode film 14e.

The first intermediate planar electrode layer 12 is formed by electrically separating a rectangular electrode film into pieces by two insulating portions 12c and 12d. The insulating portion 12c extends rightward from the middle of an end side, and then is bent upward to reach an upper side to thereby separate the electrode film into pieces so that a corner portion on the upper side of the electrode film is left rectangular and forms a second electrode portion 12b. By the insulating portion 12c, the electrode film further forms a first electrode portion 12a which is electrically separated from the second electrode portion 12b. Further, by the insulating portion 12d formed lengthwise through the first electrode portion 12a, a second-electrode right-side end portion (denoted by the same reference symbol as the second electrode portion) 12b is formed so as to be electrically separated from the first electrode portion 12a.

The second intermediate planar electrode layer 13 forms a second electrode portion 13b on the upper-left side and an L-shaped first electrode portion 13a by electrically separating an electrode film into pieces by an insulating portion 13c in the same manner as the first intermediate planar electrode layer. A right end of the first electrode portion 13a and a second-electrode right-side end portion (denoted by the same reference symbol as the second electrode portion) 13b are electrically separated from each other by an insulating portion 13d which is elongated lengthwise.

The uppermost planar electrode layer 14 is formed by electrically separating a rectangular electrode film into pieces by insulating portions 14c and 14d. The insulating portion 14c extends rightward from the middle of an end side, and then is bent downward to reach a bottom side so that a corner portion on the lower side of the electrode film is left rectangular and forms a first electrode portion 14a. By the insulating portion 14c, a second electrode portion 14b is formed so as to be electrically separated from the first electrode portion 14a. A right end of the second electrode portion 14b and a second-electrode right-side end portion (denoted by the same reference symbol as the second electrode portion) 14b are electrically separated from each other by the insulating portion 14d which is elongated lengthwise.

When the laminate 20 is formed, the back surface side of the bottom planar electrode layer 11 and the front surface side of the uppermost planar electrode layer 14 are exposed.

FIG. 4(a) and FIG. 4(b) are perspective views showing a process of forming the side electrodes at both ends of the laminate.

As shown in FIG. 4(a) and FIG. 4(b), the first side electrode 15 is formed on one end face, in the second direction (longitudinal direction) crossing the first direction, of the laminate 20 such that a first external electrode 15a made of a conductive film on one side and a second external electrode 15b made of a conductive film on the other side are disposed side by side in a third direction (width direction of the laminate) crossing the first and second directions through an insulating portion 15c interposed therebetween.

On the other hand, the second side electrode 16 made of a conductive film is formed on the other end face of the laminate 20 so as to cover the entire face.

The first electrode portions 11a, 12a, 13a, and 14a of the planar electrode layers 11, 12, 13, and 14 are electrically connected together through their ends by the first external electrode 15a of the first side electrode 15, while the second electrode portions 12b, 13b, and 14b are electrically connected together through their ends by the second external electrode 15b.

The other end of the second electrode portion 11b and ends of the second-electrode right-side end portions 12b, 13b, and 14b are electrically connected together by the second side electrode 16.

FIG. 5(a) is a perspective view showing a polarization process of the piezoelectric element, FIG. 5(b) is a diagram showing polarities of polarization potentials for the electrode patterns of the planar electrode layers, FIG. 5(c) is a diagram showing polarities of polarization potentials of the first side electrode, and FIG. 5(d) is a cross-sectional view showing the polarization process of the piezoelectric element.

As shown in FIG. 5(a) to FIG. 5(d), the polarization voltage is applied so that the uppermost second electrode portion 14b is set to (−), the bottom second electrode portion 11b is set to (+), and the first electrode portions 12a and 13a of the first and second intermediate planar electrode layers are set to (GND), and consequently, the uppermost and bottom piezoelectric body layers 23 and 21 are polarized along the first direction as indicated by arrows 31 and 32.

FIG. 6(a) is a perspective view showing a polarity pattern of the piezoelectric element by the DC voltage, FIG. 6(b) is a plan view showing polarity patterns of the planar electrode layers of the piezoelectric element of FIG. 6(a) by the DC voltage, FIG. 6(c) is a perspective view showing a polarity pattern of the first side electrode 15 of the piezoelectric element of FIG. 6(a) by the DC voltage, and FIG. 6(d) is a cross-sectional view showing the polarity pattern and operation of the piezoelectric element by the DC voltage.

As shown in FIG. 6(b), a connection electrode film 14e is added on the insulating portion 14d between the second electrode portion 14b and the right-side end portion 14b of the uppermost planar electrode layer of the laminate 20 of the piezoelectric element 1 so that the second electrode portion 14b and the right-side end portion 14b are conductively connected to each other. Likewise, a connection electrode film 11d is added on the insulating portion 11c on one end side of the second electrode portion 11b of the bottom planar electrode layer so that the second electrode portion 11b is conductively connected up to the one end of the bottom planar electrode layer.

As shown in FIG. 6(a) to FIG. 6(d), the polarity of the DC voltage causes all of the uppermost first electrode portion 14a, the first and second intermediate first electrode portions 12a and 13a, the bottom second electrode portion 11a, and the first external electrode 15a to be set to (+).

On the other hand, the uppermost second electrode portion 14b, the first and second intermediate second electrode portions 12b and 13b and the second-electrode right-side end portions 12b and 13b electrically separated from those second electrode portions 12b and 13b, the bottom second electrode portion 11b, and the second external electrode 15b are all set to (−).

As shown in FIG. 6(d), when the driving voltage is applied with the polarity shown using the first electrode portions 12a and 13a as driving internal electrodes and the second electrode portions 11b and 14b as driving external electrodes, the voltage is applied to the uppermost and bottom piezoelectric body layers 23 and 21 (see FIG. 5) respectively in a lamination direction (polarization direction) and in a direction opposite to the polarization direction. As a result, a piezoelectric element portion having the uppermost piezoelectric body layer 23 expands due to stress exerted in a direction of expansion along the second direction (longitudinal direction of the piezoelectric plate) (arrow 33) crossing the first direction by a piezoelectric effect, while a piezoelectric element portion having the bottom piezoelectric body layer 21 contracts due to stress exerted in a direction of contraction along the longitudinal direction by a piezoelectric effect (arrows 34 and 35).

On the other hand, when the polarity of the DC voltage is reversed, the piezoelectric element portion having the uppermost piezoelectric body layer 23 contracts due to stress exerted in the direction of contraction along the second direction (longitudinal direction of the piezoelectric plate) by a piezoelectric effect, while the piezoelectric element portion having the bottom piezoelectric body layer 21 expands due to stress exerted in the direction of expansion along the second direction (longitudinal direction of the piezoelectric plate) by a piezoelectric effect.

Therefore, the piezoelectric element 1 serves as a bimorph element that performs bending vibration by the application of AC driving voltage.

FIG. 7(a) and FIG. 7(b) are perspective views showing a process of attaching the FPC board to the piezoelectric element 1.

As shown in FIG. 7(a) and FIG. 7(b), using the first electrode portion 14a on one end side of the upper surface of the piezoelectric element 1 and a portion, on the one end side, of the second electrode portion 14b as element electrodes serving as electrode lead-out portions, electrical connection can be achieved only by causing the conductor patterns 4a and 4b, formed on the back surface of the FPC board 4, to overlap and contact with the element electrodes.

The FPC board is attached to the piezoelectric element 1 by soldering the conductor patterns of the FPC board 4 to the electrode portions of the piezoelectric element 1, but not limited to such a fixing method. Use may also be made of bonding with an adhesive such as a conductive adhesive, bonding with conductive adhesive tape, or the like.

Figure 8:
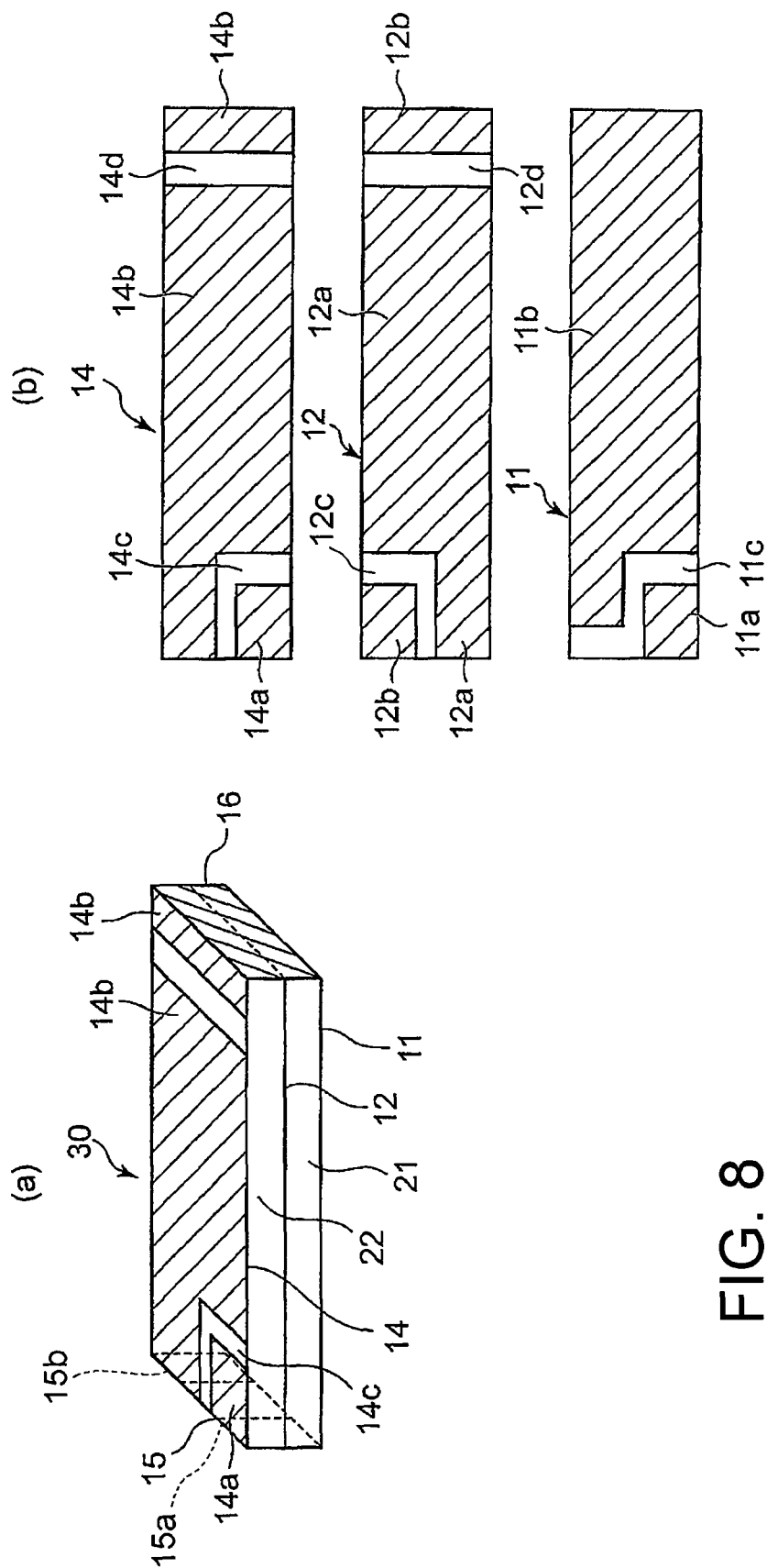
FIG. 8 includes (a) which is a perspective view showing a modification of the piezoelectric element according to the embodiment of this invention and (b) which is a plan view showing electrode layers of the piezoelectric element of (a).

FIG. 8(a) is a perspective view showing a modification of the piezoelectric element according to the embodiment of this invention and FIG. 8(b) is a plan view showing planar electrode layers of the piezoelectric element of FIG. 8(a).

A piezoelectric element 30 according to the modification shown in FIG. 8(a) and FIG. 8(b) has the same structure as the piezoelectric element shown in FIG. 3(a) except that the number of intermediate planar electrode layers and the number of piezoelectric body layers are each smaller by one. That is, as shown in FIG. 8(a), on a bottom planar electrode layer 11 at one end in the lamination direction (first direction), a piezoelectric body layer 21, an intermediate planar electrode layer 12, a piezoelectric body layer 22, and an uppermost planar electrode layer 14 at the other end in the first direction are laminated in this order. That is, the piezoelectric element is formed as a laminate of piezoelectric element portions respectively having the piezoelectric body layers 21, 22.

The bottom planar electrode layer 11 is formed by separating a single electrode film into pieces by an insulating portion 11c. The insulating portion 11c extends downward from an edge on one end side of the electrode film, then extends rightward from the middle of an end side, and then is bent downward to reach a bottom side to thereby separate the electrode film into pieces so that a corner portion on the lower side is left rectangular and forms a first electrode portion 11a. By the insulating portion 11c, a second electrode portion 11b is formed so as to be electrically separated from the first electrode portion 11a.

The first intermediate planar electrode layer 12 is formed by electrically separating an electrode film into pieces by insulating portions 12c and 12d. The insulating portion 12c extends rightward from the middle of an end side, and then is bent upward to reach an upper side so that a corner portion on the upper side of the electrode film is left rectangular and forms a second electrode portion 12b. By the insulating portion 12c, a first electrode portion 12a is formed so as to be electrically separated from the second electrode portion 12b. Further, the first electrode portion 12a and a second-electrode right-side end portion (denoted by the same reference symbol as the second electrode portion) 12b are formed by the insulating portion 12d formed lengthwise through the first electrode portion 12a.

The uppermost planar electrode layer 14 has three electrode portions formed by electrically separating an electrode film into pieces by insulating portions 14c and 14d. The insulating portion 14c extends rightward from the middle of an end side, and then is bent downward to reach a bottom side to thereby separate the electrode film into pieces so that a corner portion on the lower side is left rectangular and forms a first electrode portion 14a. By the insulating portion 14c, a second electrode portion 14b is formed so as to be electrically separated from the first electrode portion 14a. A right end of the second electrode portion 14b and a second-electrode right-side end portion (denoted by the same reference symbol as the second electrode portion) 14b are electrically separated from each other by the insulating portion 14d which is elongated lengthwise.

When the laminate is formed, the back surface side, in the lamination direction, of the bottom planar electrode layer 11 and the front surface side of the uppermost planar electrode layer 14 are exposed.

A first side electrode 15 and a second side electrode 16 are provided on both end faces of the laminate in the same manner as shown in FIG. 4(a) and FIG. 4(b).

The first electrode portions 11a, 12a, and 14a of the planar electrode layers 11, 12, and 14 are electrically connected together through their ends by a first external electrode 15a of the first side electrode 15, while the second electrode portions 12b and 14b are electrically connected together through their ends by a second external electrode 15b.

The other end of the second electrode portion 11b and ends of the second-electrode right-side end portions 12b and 14b are electrically connected together by the second side electrode 16.

Figure 5:
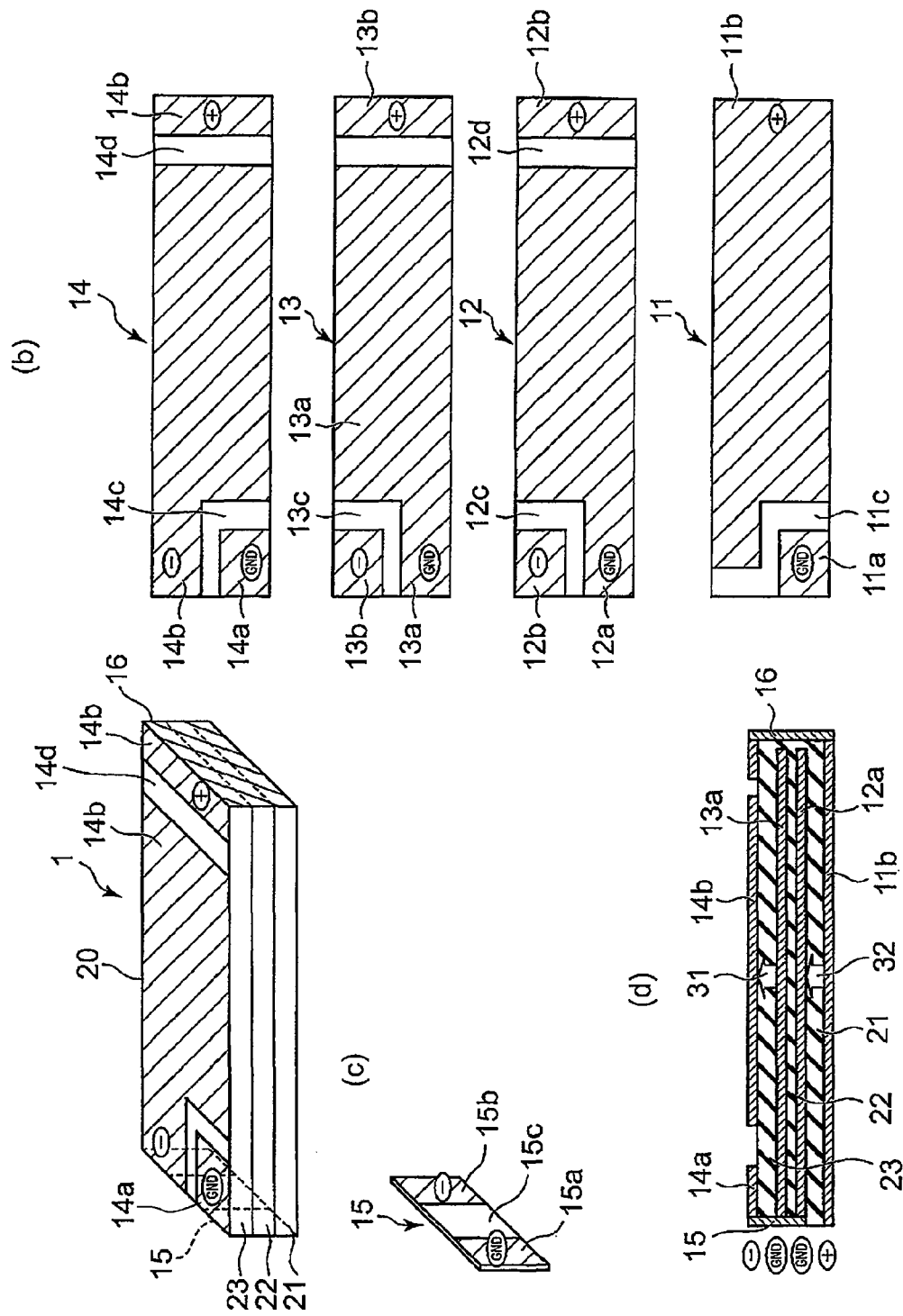
FIG. 5 includes (a) which is a perspective view showing a polarization process of the piezoelectric element according to the embodiment of this invention, (b) which is a plan view showing polarities of polarization potentials for the electrode patterns of the electrode layers according to the embodiment of this invention, (c) which is a perspective view showing polarities of polarization potentials of the first side electrode according to the embodiment of this invention, and (d) which is a cross-sectional view showing the polarization process of the piezoelectric element according to the embodiment of this invention.

Also in the case of the piezoelectric element 30 according to the modification of the first embodiment of this invention, as in the case of the piezoelectric element shown in FIG. 5, the polarization voltage is applied with the same polarity pattern and consequently the piezoelectric element portions having the uppermost piezoelectric body layer 22 and the bottom piezoelectric body layer 21 are polarized along the first direction (thickness direction) of the piezoelectric body layers.

Figure 6:
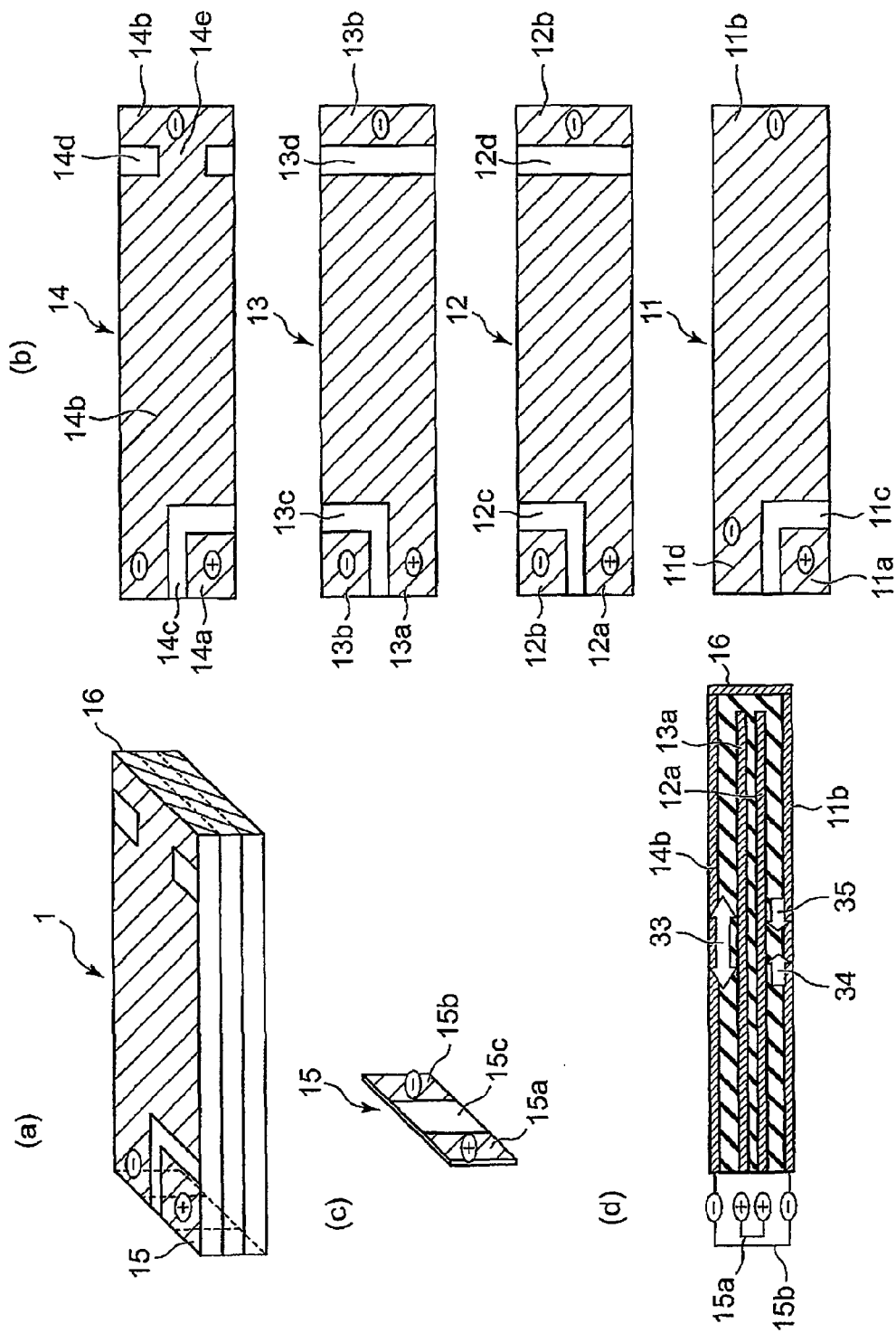
FIG. 6 includes (a) which is a perspective view showing a polarity pattern of the piezoelectric element according to the embodiment of this invention by the driving voltage, (b) which is a plan view showing polarity patterns of the electrode layers of the piezoelectric element of (a) by the driving voltage, (c) which is a perspective view showing a polarity pattern of the first side electrode of the piezoelectric element of (a) by the driving voltage, and (d) which is a cross-sectional view showing the polarity pattern and operation of the piezoelectric element of (a) by the driving voltage.

Also in the case of the piezoelectric element 30 according to the modification, by adding connection electrode films 11d and 14e respectively to the bottom planar electrode layer 11 and the uppermost planar electrode layer 14 as shown in FIG. 6 and by applying the DC voltage with the same polarity pattern as shown in FIG. 6, the voltage is applied to the piezoelectric element portion having the uppermost piezoelectric body layer 22 and the piezoelectric element portion having the bottom piezoelectric body layer 21 respectively in a lamination direction (polarization direction) and in a direction opposite to the polarization direction. As a result, the piezoelectric element portion having the uppermost piezoelectric body layer 22 expands due to stress exerted in a direction of expansion along the second direction (longitudinal direction) by a piezoelectric effect, while the piezoelectric element portion having the bottom piezoelectric body layer 21 contracts due to stress exerted in a direction of contraction along the second direction (longitudinal direction) by a piezoelectric effect.

On the other hand, when the polarity of the DC voltage is reversed, the piezoelectric element portion having the uppermost piezoelectric body layer 22 contracts due to stress exerted in the direction of contraction along the second direction (longitudinal direction) by a piezoelectric effect, while the piezoelectric element portion having the bottom piezoelectric body layer 21 expands due to stress exerted in the direction of expansion along the second direction (longitudinal direction) by a piezoelectric effect.

Therefore, the piezoelectric element 30 serves as a bimorph element that performs bending vibration by the application of AC driving voltage.

Figure 12:
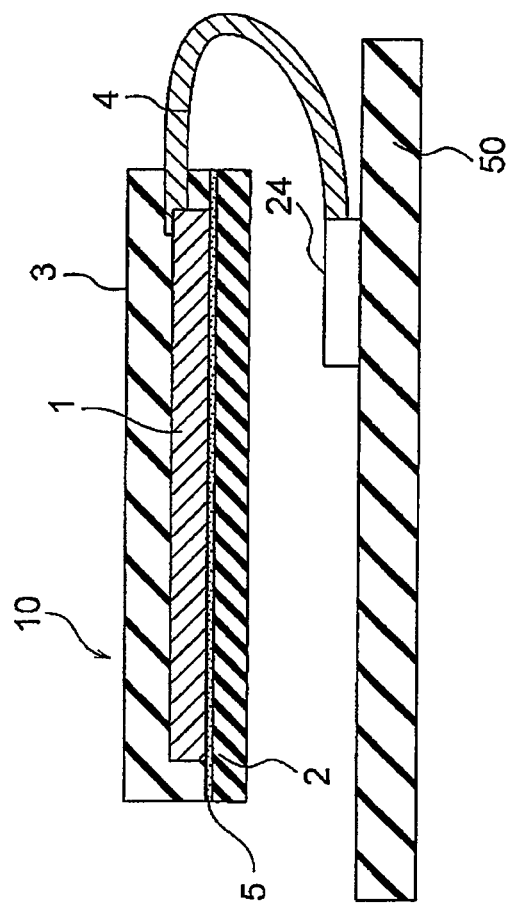
FIG. 12 is a cross-sectional view showing a mounting method of the piezoelectric vibration module according to the first embodiment of this invention.

FIG. 12 is a cross-sectional view showing a mounting method of the piezoelectric vibration module according to the first embodiment of this invention. As shown in FIG. 12, the piezoelectric vibration module 10 is mounted to a drive circuit board (PWB) 50 by inserting the FPC board 4, drawn out from an end face of the piezoelectric vibration module, into a connector 24 mounted on the PWB 50.

FIG. 13(a) is a perspective view showing a piezoelectric vibration module according to an embodiment of this invention, FIG. 13(b) is a cross-sectional view taken along line 13B-13B' of FIG. 13(a), FIG. 13(c) is a cross-sectional view taken along line 13C-13C' of FIG. 13(a), and FIG. 13(d) is a plan view showing a state of connection of a piezoelectric element 1 to a conductive member 25.

As shown in FIG. 13(a), FIG. 13(b), and FIG. 13(c), a piezoelectric vibration module 10 comprises a rectangular piezoelectric element 1, an anisotropic conductive rubber which is an elastic conductive member 25 as a lead-out wiring member connected to one surface of the piezoelectric element 1 and which is conductive in a thickness direction of the piezoelectric element 1 while insulating in an in-plane direction of the piezoelectric element 1 (hereinafter, the conductive rubber will be denoted by the same reference symbol 25), an elastic plate 2 bonded to the other surface of the piezoelectric element 1 through an adhesive 5, and a housing member 3 covering the piezoelectric element 1 jointly with the elastic plate 2. The conductive rubber 25 passes through the housing member 3 and protrudes on one surface side of the piezoelectric vibration module 10.

As in the first embodiment shown in FIG. 1, the elastic plate 2 is made of a silicone rubber having a durometer hardness defined by JIS K 623 of 30 to 130 in order to achieve an improvement in temperature stability characteristics and an improvement in vibration displacement and having a thickness of 0.1 to 0.9 mm in order to achieve both an increase in vibration displacement and the drop impact resistance.

The conductive rubber 25 as the conductive member 25 is provided on the surface, near its end, of the piezoelectric element 1.

The elastic plate 2 is bonded to the surface, on the side opposite to and facing the surface on which the conductive member 25 is provided, of the piezoelectric element 1 through the adhesive 5 such as a cold-setting adhesive or silicone-based double-sided tape. Preferably, the hardness of the adhesive 5 is equal to or less than that of the elastic plate 2.

As in the first embodiment shown in FIG. 2, the elastic plate 2 is used by being bonded to a diaphragm 6 of a touch panel. However, it can also be used as a speaker of a smartphone or the like or it can also generate low-frequency vibration of a vibrator or the like other than in the audible range.

FIG. 14(a) is a diagram showing a manufacturing process of a piezoelectric element for use in a piezoelectric vibration module according to a second embodiment of this invention and is a perspective view of a laminate forming the piezoelectric element, and FIG. 14(b) is a diagram showing the manufacturing process of the piezoelectric element for use in the piezoelectric vibration module according to the embodiment of this invention and is a plan view showing electrode patterns of planar electrode layers of the laminate.

Figure 14:
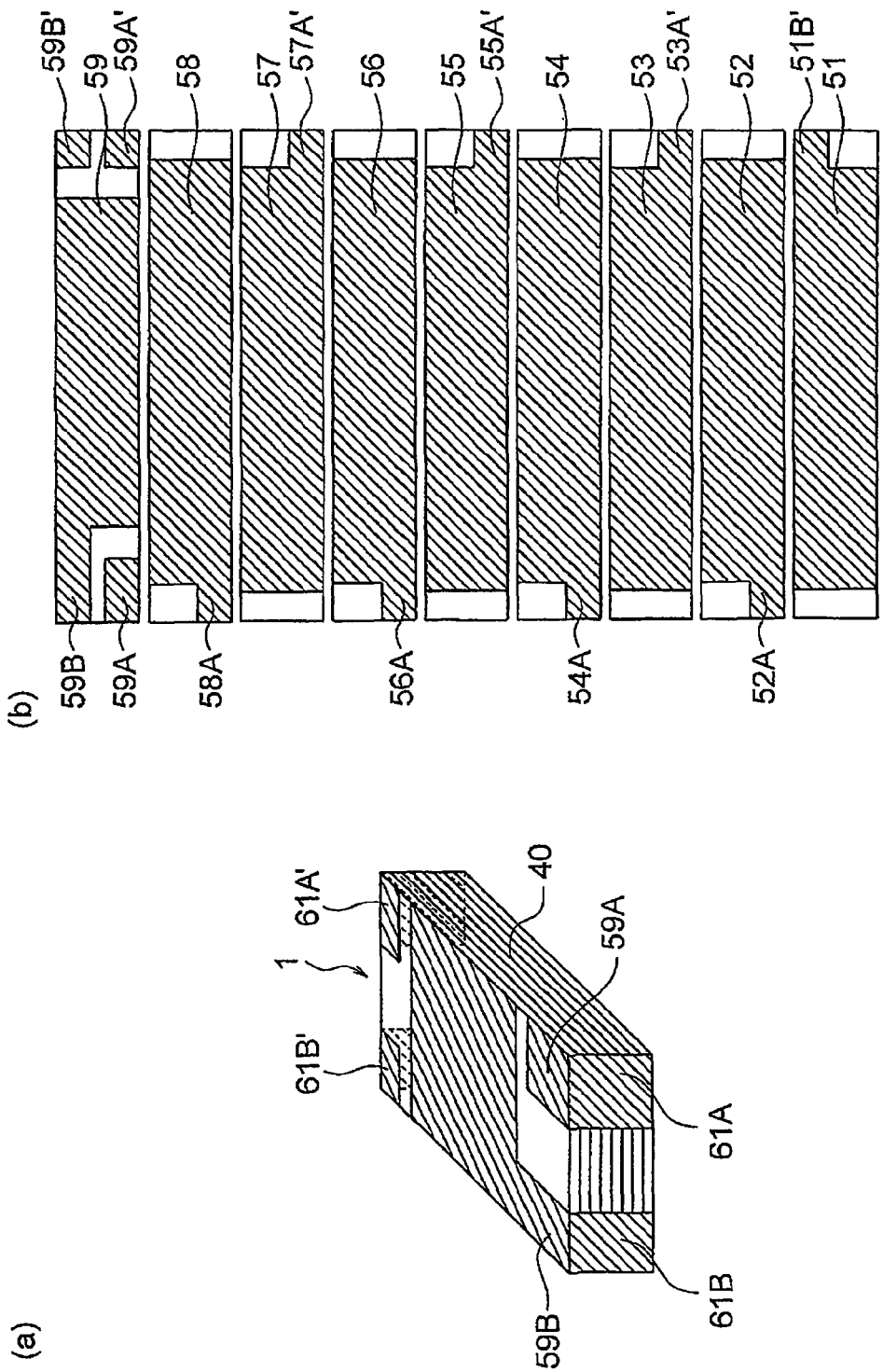
FIG. 14 includes (a) which is a diagram showing a manufacturing process of a piezoelectric element for use in a piezoelectric vibration module according to a second embodiment of this invention and is a perspective view showing a laminate forming the piezoelectric element, and (b) which is a diagram showing the manufacturing process of the piezoelectric element for use in the piezoelectric vibration module according to the embodiment of this invention and is a plan view showing electrode patterns of planar electrode layers of the laminate.
Figure 15:
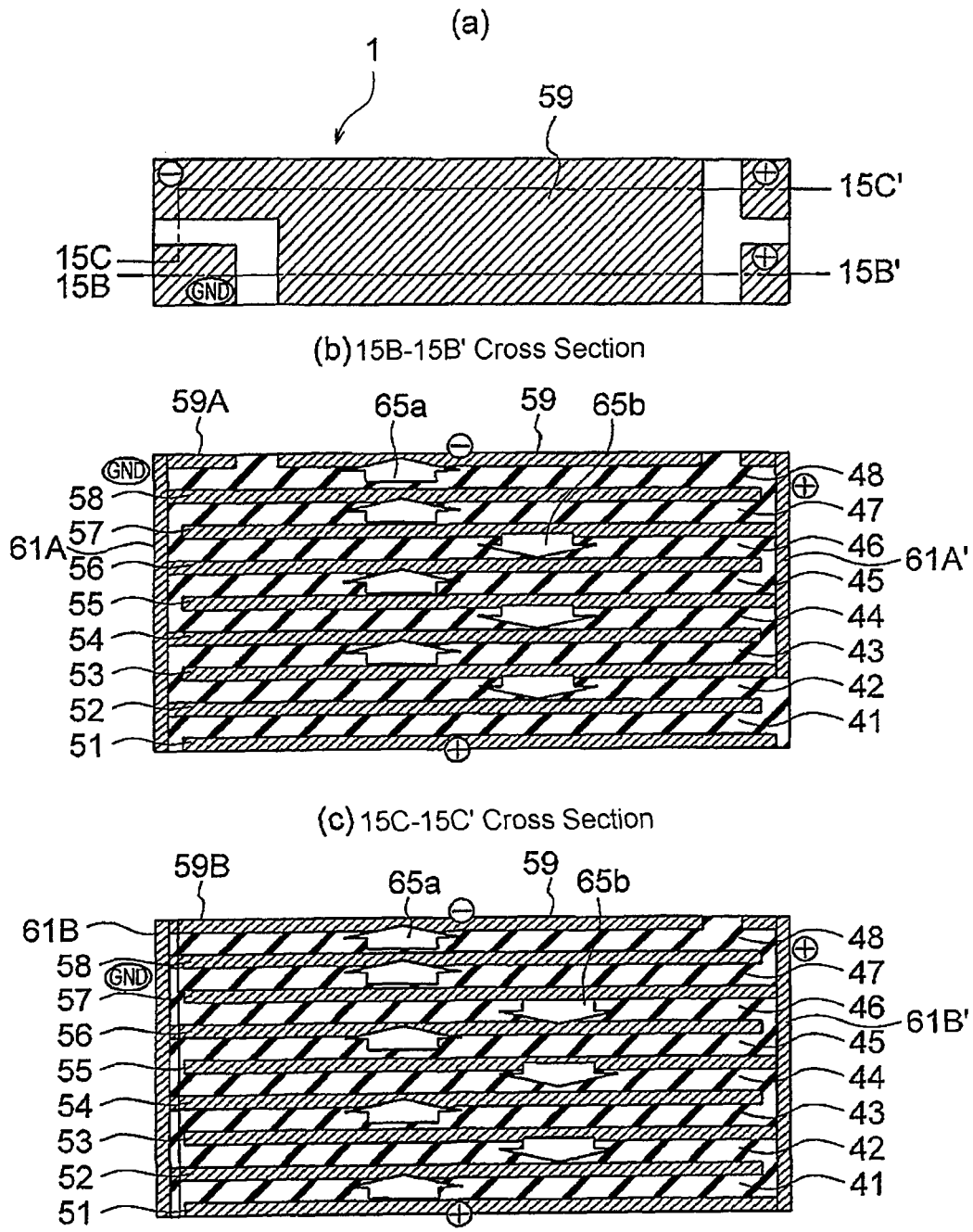
FIG. 15 includes (a) which is a plan view showing a polarization process of the piezoelectric element according to the second embodiment of this invention shown in FIG. 13(a), FIG. 13(b), and FIG. 13(c), (b) which is a cross-sectional view taken along line 15B-15B' of FIG. 15(a) and showing polarities of polarization potentials for the electrode patterns of the electrode layers of the piezoelectric element of FIGS. 15(a), and (c) which is a cross-sectional view taken along line 15C-15C' of FIG. 15(a) and showing polarities of polarization potentials for the electrode patterns of the electrode layers of the piezoelectric element of FIG. 15(a).

As shown in FIG. 14(a), FIGS. 14(b) and 15(b), a piezoelectric element 1 is formed by alternately laminating piezoelectric body layers 41, 42, 43, 44, 45, 46, 47, and 48 each in the form of a rectangular piezoelectric ceramic plate and planar electrode layers 51, 52, 53, 54, 55, 56, 57, 58, and 59 each in the form of a conductor film and further by forming first side electrodes 61A and 61B and second side electrodes 61A' and 61B' respectively on both end faces in a second direction crossing a lamination direction (first direction). The piezoelectric body layers 41, 42, 43, 44, 45, 46, 47, and 48 along with the planar electrode layers formed on respective surfaces thereof respectively form piezoelectric element portions and these piezoelectric element portions are laminated in the first direction to form a laminate 40.

That is, on the bottom planar electrode layer 51 at one end in the first direction as the lamination direction of the laminate, the piezoelectric body layer 41, the first intermediate planar electrode layer 52, the piezoelectric body layer 42, the second intermediate planar electrode layer 53, the piezoelectric body layer 43, the third intermediate planar electrode layer 54, the piezoelectric body layer 44, the fourth intermediate planar electrode layer 55, the piezoelectric body layer 45, the fifth intermediate planar electrode layer 56, the piezoelectric body layer 46, the sixth intermediate planar electrode layer 57, the piezoelectric body layer 47, the seventh intermediate planar electrode layer 58, the piezoelectric body layer 48, and the uppermost planar electrode layer 59 are laminated in this order. The piezoelectric body layers 41 to 48 each having the planar electrode layers on its front and back surfaces form the piezoelectric element portions, respectively.

In the second embodiment of this invention, the piezoelectric ceramic plates of a PZT-based material, which is the same as that in the first embodiment, are used as the piezoelectric body layers 41 to 48. However, naturally, any material may be used as long as it is a material having a piezoelectric effect.

The bottom planar electrode layer 51 has a rectangular electrode film formed at a middle portion of the surface of the piezoelectric body layer 41 and a second lead-out electrode 51B' drawn out to the other end side opposite to one end side.

The first to seventh intermediate planar electrode layers 52 to 58 have first lead-out electrodes 52A, 54A, 56A, and 58A on the one end side and second lead-out electrodes 53A', 55A', and 57A' on the other end side which are formed on end faces, in the longitudinal direction (the second direction crossing the first direction), of the planar electrode layers so as to be drawn out to one end and the other end in a staggered manner as proceeding in the first direction.

The uppermost planar electrode layer 59 has an electrode portion (denoted by the same symbol 59), a first lead-out electrode 59B drawn out to the one end side, and a first terminal electrode 59A provided on the one end side and electrically insulated from the first lead-out electrode. On the other end side, the uppermost planar electrode layer 59 has a pair of second terminal electrodes 59A' and 59B' which are insulated from the electrode portion.

The first lead-out electrodes 52A, 54A, 56A, and 58A of the intermediate planar electrode layers are electrically connected together by the first side electrode 61A. The uppermost first terminal electrode 59A is electrically connected to the first side electrode 61A. The uppermost first lead-out electrode 59B is electrically connected to the first side electrode 61B. The uppermost second terminal electrode 59A' and the intermediate second lead-out electrodes 53A', 55A', and 57A' are electrically connected together by the second side electrode 61A'. The uppermost second terminal electrode 59B' and the bottom second lead-out electrode 51B' are electrically connected together by the second side electrode 61B'.

FIG. 15(a) is a plan view showing a polarization process of the piezoelectric element according to the second embodiment of this invention shown in FIG. 13(a), FIG. 13(b), and FIG. 13(c), FIG. 15(b) is a cross-sectional view taken along line 15B-15B' of FIG. 15(a) and showing polarities of polarization potentials for the electrode patterns of the electrode layers of the piezoelectric element of FIG. 15(a), and FIG. 15(c) is a cross-sectional view taken along line 15C-15C' of FIG. 15(a) and showing polarities of polarization potentials for the electrode patterns of the electrode layers of the piezoelectric element of FIG. 15(a).

As shown in FIG. 15(a) to FIG. 15(c), the polarization voltage is applied so that the polarity of the uppermost planar electrode portion 59 is set to (−), the polarities of the bottom planar electrode portion 51 and the subsequent alternate planar electrode layers 53, 55, and 57 in the lamination direction are set to (+), and the polarities of the planar electrode layer 52, which is one layer above the bottom layer in the lamination direction, and the subsequent alternate planar electrode layers 54, 56, and 58 are set to (GND), and consequently, the piezoelectric element portions having the piezoelectric body layers 41, 43, 45, 47, and 48 are respectively polarized along the first direction as indicated by arrows 65a and the piezoelectric element portions having the piezoelectric body layers 42, 44, and 46 are respectively polarized along the first direction as indicated by arrows 65b.

FIG. 16(a) is a plan view and a cross-sectional view showing one example of a polarity pattern of the piezoelectric element shown in FIGS. 15(a) and (b) by the driving voltage and FIG. 16(b) is a plan view and a cross-sectional view showing another example of a polarity pattern of the planar electrode layers of the piezoelectric element by the driving voltage.

As shown in FIG. 16(a), in the piezoelectric element 1, a connection electrode portion 59c is added between the second terminal electrode 59A' and the electrode portion 59 of the uppermost planar electrode layer of the laminate of the piezoelectric element portions having the piezoelectric body layers so that the second side electrode 61A' and the connection electrode portion 59C are conductively connected to each other. On the other hand, the first terminal electrode 59A and the first side electrode 61A are conductively connected to each other.

As shown in FIG. 16(a), the polarity of the applied DC voltage causes the uppermost planar electrode portion 59 and the subsequent alternate planar electrode layers 57, 55, and 53 to be set to (−) and causes the uppermost first terminal electrode 59A, the planar electrode layer 58, which is one layer below the uppermost planar electrode portion 59, and the subsequent alternate planar electrode layers 56, 54, and 52 below the planar electrode layer 58 to be set to (+).

As shown in FIG. 16(a), when the DC voltage is applied with the polarity shown in FIG. 16(a), the voltage is applied to the piezoelectric element portions having the piezoelectric body layers 42, 44, 46, and 48 in a direction indicated by arrows 66c, while the voltage is applied to the piezoelectric element portions having the piezoelectric body layers 43, 45, and 47 in a direction indicated by arrows 66d. As a result, only the piezoelectric element portion having the uppermost piezoelectric body layer 48 expands in the second direction as indicated by arrows 66a, while the remaining piezoelectric element portions having the piezoelectric body layers 42, 43, 44, 45, 46, and 47, other than the piezoelectric element portions having the uppermost piezoelectric body layer 48 and the bottom piezoelectric body layer 41, contract in the second direction as indicated by arrows 66b. The bottom planar electrode layer 51 and the piezoelectric body layer 41 do not contribute to contraction vibration.

Therefore, when the AC driving voltage is applied with the polarity shown in FIG. 16(a), only the piezoelectric element portion having the uppermost piezoelectric body layer 48 expands in the second direction and the piezoelectric element portions having the piezoelectric body layers 42, 43, 44, 45, 46, 47, and 48 make expansion-contraction vibration in the second direction. Since these vibration directions are opposite to each other as indicated by the arrows 66*a* and 66*b*, bending vibration consequently occurs in the piezoelectric element 1.

Figure 16:
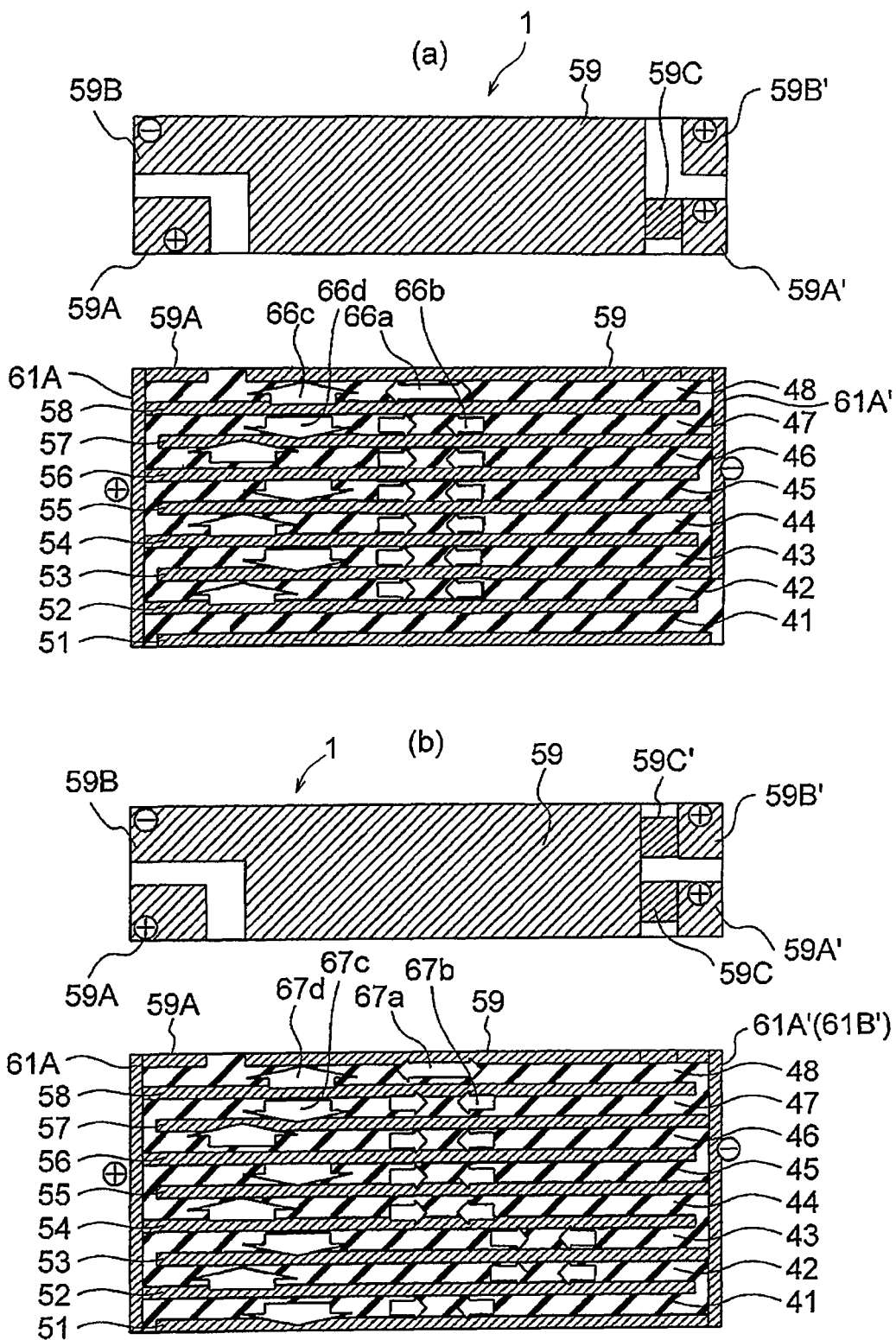
FIG. 16 includes (a) which is a plan view and a cross-sectional view showing one example of a polarity pattern of the piezoelectric element shown in FIG. 15(a) and FIG. 15(b) by the driving voltage and (b) which is a plan view and a cross-sectional view showing another example of a polarity pattern of the electrode layers of the piezoelectric element by the driving voltage.

As shown in FIG. 16(*b*), connection electrode portions 59C and 59C' are respectively added between the second terminal electrodes 59A' and 59B' and the electrode portion 59 of the uppermost planar electrode layer of the laminate of the piezoelectric element 1 so that the second side electrodes 61A' and 61B' and the connection electrode portions 59C and 59C' are conductively connected to each other. On the other hand, the first terminal electrode 59A and the first lead-out electrode 59B are conductively connected to the first side electrodes 61A and 61B.

As shown in FIG. 16(*b*), the polarity of the applied voltage causes the uppermost electrode portion 59, the subsequent alternate electrode layers 57, 55, and 53, and the bottom electrode layer 51 to be set to (−) and causes the uppermost first terminal electrode 59A, the electrode portion 58, which is one layer below the uppermost electrode portion 59, and the subsequent alternate planar electrode layers 56, 54, and 52 below the electrode portion 58 to be set to (+).

As shown in FIG. 16(*b*), when the DC voltage is applied with the polarity shown in FIG. 16(*b*), the voltage is applied to the piezoelectric element portions having the piezoelectric body layers 41, 43, 45, and 47 in a direction indicated by arrows 67*c*, while the voltage is applied to the piezoelectric element portions having the piezoelectric body layers 42, 44, 46, and 48 in a direction indicated by arrows 67*d*. As a result, only the piezoelectric element portion having the uppermost piezoelectric body layer 48 expands in the second direction as indicated by arrows 67*a*, while the remaining piezoelectric element portions having the piezoelectric body layers 41, 42, 43, 44, 45, 46, and 47, other than the piezoelectric element portion having the uppermost piezoelectric body layer 48, contract in the second direction as indicated by arrows 67*b*.

Therefore, when the AC driving voltage is applied with the polarity shown in FIG. 16(*b*), only the piezoelectric element portion having the uppermost piezoelectric body layer 48 makes expansion-contraction vibration in the second direction and the piezoelectric element portions having the piezoelectric body layers 41, 42, 43, 44, 45, 46, 47, and 48 make expansion-contraction vibration in the second direction. Since these vibration directions are opposite to each other as indicated by the arrows 67*a* and 67*b*, bending vibration consequently occurs in the piezoelectric element 1.

Figure 17:
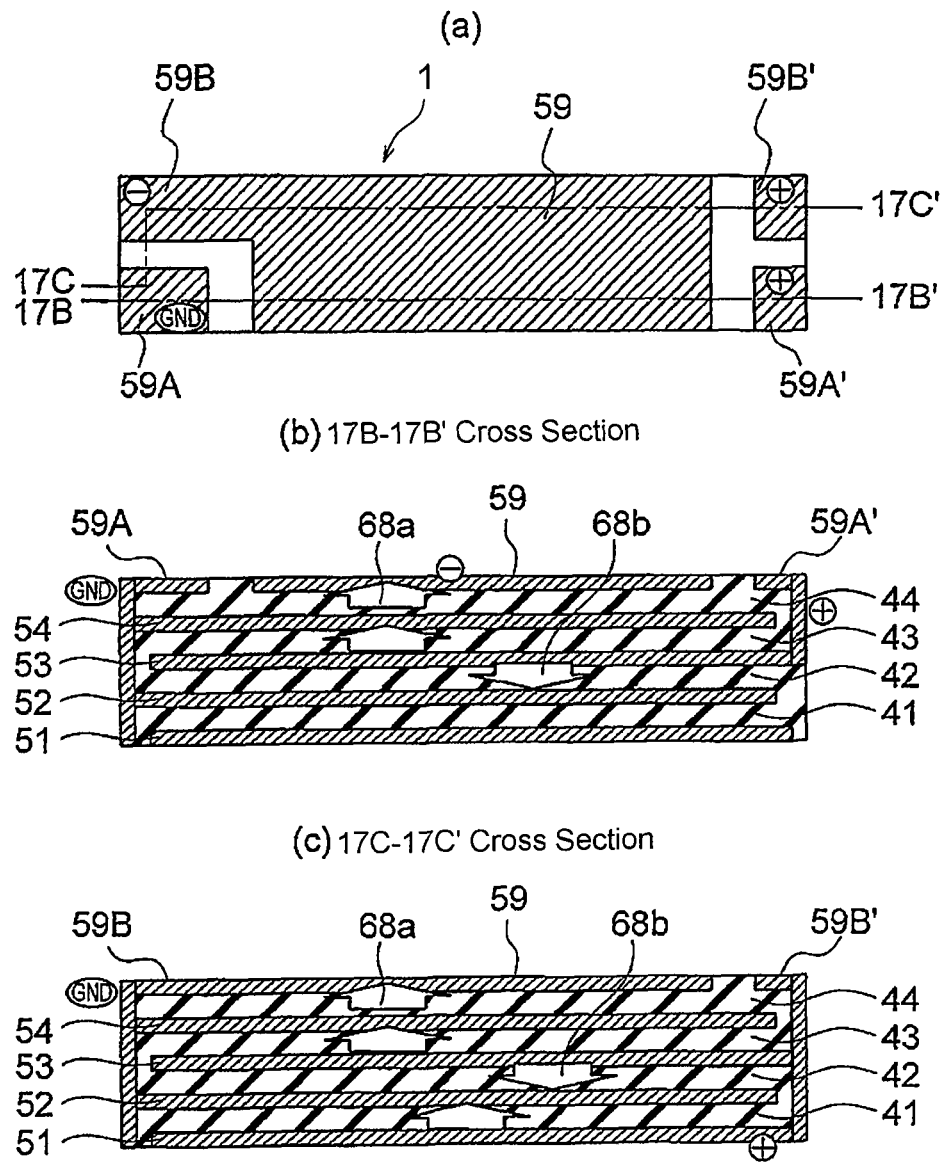
FIG. 17 includes (a) which is a plan view showing a polarization process of a piezoelectric element according to another example, (b) which is a cross-sectional view taken along line 17B-17B' of (a) and showing polarities of polarization potentials for electrode patterns of electrode layers, and (c) which is a cross-sectional view taken along line 17C-17C' of (a) and showing polarities of polarization potentials for the electrode patterns of the electrode layers.

FIG. 17(*a*) is a plan view showing a polarization process of a piezoelectric element according to another example, FIG. 17(*b*) is a cross-sectional view taken along line 17B-17B' of (a) and showing polarities of polarization potentials for electrode patterns of electrode layers, and FIG. 17(*c*) is a cross-sectional view taken along line 17C-17C' of (a) and showing polarities of polarization potentials for the electrode patterns of the electrode layers.

As shown in FIG. 17(*a*) to FIG. 17(*c*), a piezoelectric element 1 comprises a laminate having four piezoelectric body layers and the polarization voltage is applied so that an uppermost electrode portion 59 is set to (−), a bottom electrode portion 51 and an electrode layer 53 skipping one layer in the lamination direction are set to (+), and a planar electrode layer 52, which is one layer above the bottom portion in the lamination direction, and a planar electrode layer 54 skipping one layer from the planar electrode layer 52 are set to (GND), and consequently, a piezoelectric body layer 41 and piezoelectric body layers 43 and 44 are respectively polarized along the first direction as indicated by arrows 68*a* and a piezoelectric body layer 42 is polarized along the first direction as indicated by an arrow 68*b*.

Figure 18:
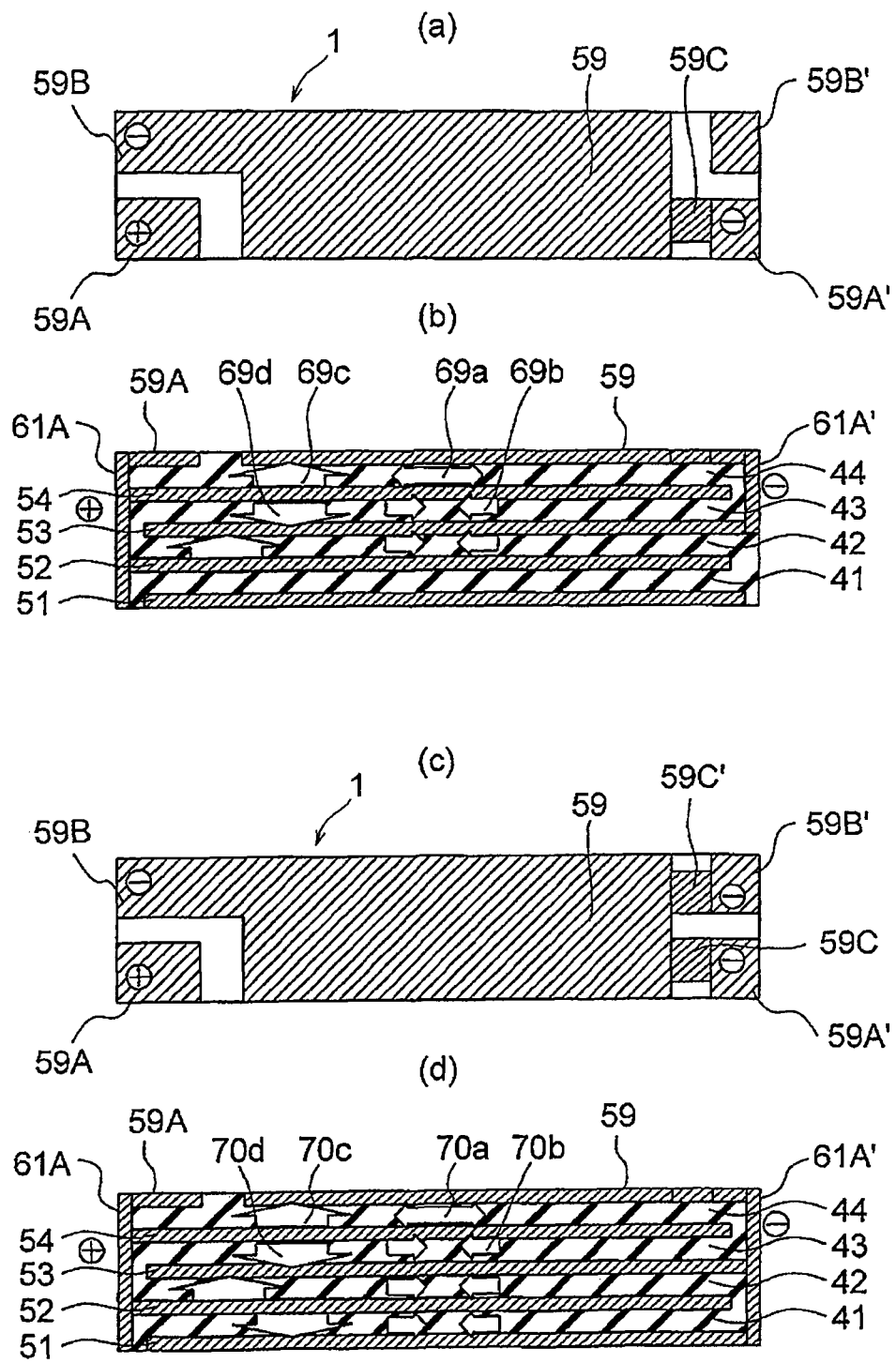
FIG. 18 includes (a) and (b) which are a plan view and a cross-sectional view showing one example of a polarity pattern when the DC voltage is applied to the piezoelectric element shown in FIGS. 17(a), and (c) and (d) which are a plan view and a cross-sectional view showing another example of a polarity pattern of the planar electrode layers of the piezoelectric element by the driving voltage.

FIGS. 18(*a*) and (*b*) are a plan view and a cross-sectional view showing one example of a polarity pattern when the DC voltage is applied to the piezoelectric element shown in FIG. 17(*a*), and FIGS. 18(*c*) and (*d*) are a plan view and a cross-sectional view showing another example of a polarity pattern of the planar electrode layers of the piezoelectric element by the driving voltage.

As shown in FIGS. 18(*a*) and (*b*), in the piezoelectric element 1, a connection electrode portion 59C is added so that a second terminal electrode 59A' and an electrode portion 59 of the uppermost planar electrode layer of the laminate of the piezoelectric body layers are conductively connected to each other. A second side electrode 61A' and the second terminal electrode 59A' are conductively connected to each other. On the other hand, a first terminal electrode 59A and a first side electrode 61A are conductively connected to each other.

As shown in FIG. 18(*a*) and FIG. 18(*b*), the polarity of the applied DC voltage causes the uppermost planar electrode layer 59 and the planar electrode layer 53 skipping one layer from the uppermost planar electrode layer 59 to be set to (−) and causes the uppermost first terminal electrode 59A, the planar electrode layer 54, which is one layer below the uppermost planar electrode layer 59, and the planar electrode layer 52 skipping one layer from the planar electrode layer 54 to be set to (+).

As shown in FIG. 18(*b*), when the DC voltage is applied with the polarity pattern shown in FIG. 18(*a*) and FIG. 18(*b*), the voltage is applied to piezoelectric element portions having the piezoelectric body layers 42 and 44 in a direction indicated by arrows 69*c*, while the voltage is applied to a piezoelectric element portion having the piezoelectric body layer 43 in a direction indicated by an arrow 69*d*. As a result, only the piezoelectric element portion having the uppermost piezoelectric body layer 44 expands in the second direction as indicated by arrows 69*a*, while the remaining piezoelectric element portions having the piezoelectric body layers 42 and 43, other than the piezoelectric element portion having the uppermost piezoelectric body layer 44 and a piezoelectric element portion having the bottom piezoelectric body layer 41, contract in the second direction as indicated by arrows 69*b*. The piezoelectric element portion having the bottom planar electrode layer 51 and the piezoelectric body layer 41 does not contribute to contraction vibration.

Therefore, when the AC driving voltage is applied with the polarity pattern shown in FIG. 18(*a*) and FIG. 18(*b*), only the piezoelectric element portion having the uppermost piezoelectric body layer 44 makes expansion-contraction vibration in the second direction and the remaining piezoelectric element portions having the piezoelectric body layers 42 and 43, other than the piezoelectric element portion having the uppermost piezoelectric body layer and the piezoelectric element portion having the bottom piezoelectric body layer 41, make expansion-contraction vibration in the second direction. Since these vibrations occur in the mutually opposite directions as indicated by the arrows 69*a* and 69*b*, the vibrations are combined so that the piezoelectric element 1 performs bending vibration.

As shown in FIG. 18(c) and FIG. 18(d), connection electrode portions 59C and 59C' are respectively added between second terminal electrodes 59A' and 59B' and a planar electrode portion 59 of the uppermost planar electrode layer of the laminate of the piezoelectric element 1 according to another example so that second side electrodes 61A' and 61B' are conductively connected to the planar electrode portion 59 through the second terminal electrodes 59A' and 59B' and the connection electrode portions 59C and 59C'. On the other hand, a first terminal electrode 59A and a first lead-out electrode 59B are conductively connected to first side electrodes 61A and 61B.

As shown in FIGS. 18 (c) and (d), the polarity pattern of the applied DC voltage causes the uppermost planar electrode portion 59 and the subsequent alternate planar electrode layer 53 and bottom planar electrode layer 51 to be set to (−) and causes the uppermost first terminal electrode 59A, the planar electrode layer 54, which is one layer below the uppermost planar electrode portion 59, and the subsequent alternate planar electrode layer 52 below the planar electrode layer 54 to be set to (+).

As shown in FIG. 18(d), when the DC voltage is applied with the polarity shown in FIGS. 18(c) and (d), the voltage is applied to piezoelectric element portions having the piezoelectric body layers 42 and 44 in a direction indicated by arrows 70c, while the voltage is applied to piezoelectric element portions having the piezoelectric body layers 41 and 43 in a direction indicated by arrows 70d. As a result, only the uppermost piezoelectric body layer 44 expands in the second direction as indicated by arrows 70a, while the remaining piezoelectric body layers 41, 42, and 43, other than the uppermost piezoelectric body layer 44, contract in the second direction as indicated by arrows 70b.

Therefore, when the AC driving voltage is applied with the polarity shown in FIG. 18(c) and FIG. 18(d), only the piezoelectric element portion having the uppermost piezoelectric body layer 44 makes expansion-contraction vibration in the second direction and the remaining piezoelectric element portions having the piezoelectric body layers 41, 42, and 43, other than the piezoelectric element portion having the uppermost piezoelectric body layer, make expansion-contraction vibration in the second direction. Since these vibrations occur in the mutually opposite directions as indicated by the arrows 70a and 70b, the vibrations are combined so that the piezoelectric element performs bending vibration.

FIG. 20(a) is a perspective view showing a modification of the piezoelectric vibration module according to the second embodiment of this invention, FIG. 20(b) is a cross-sectional view taken along line 20B-20B' of FIG. 20(a), FIG. 20(c) is a cross-sectional view taken along line 20C-20C' of FIG. 20(a), and FIG. 20(d) is a plan view showing a state of connection of conductive members.

Referring to FIG. 20(a), FIG. 20(b), FIG. 20(c), and FIG. 20(d), the piezoelectric vibration module according to the modification of the second embodiment differs from the piezoelectric vibration module according to the second embodiment in the number of elastic conductive members 25. That is, a piezoelectric vibration module 10 according to the modification has, in addition to a conductive member 25 on one end side, in the second direction, of an uppermost planar electrode layer of a piezoelectric element 1, a conductive member 26 made of the same conductive rubber as the conductive member 25 and provided at the other end in the second direction so as to bridge second terminal electrodes 59A' and 59B'.

Figure 20:
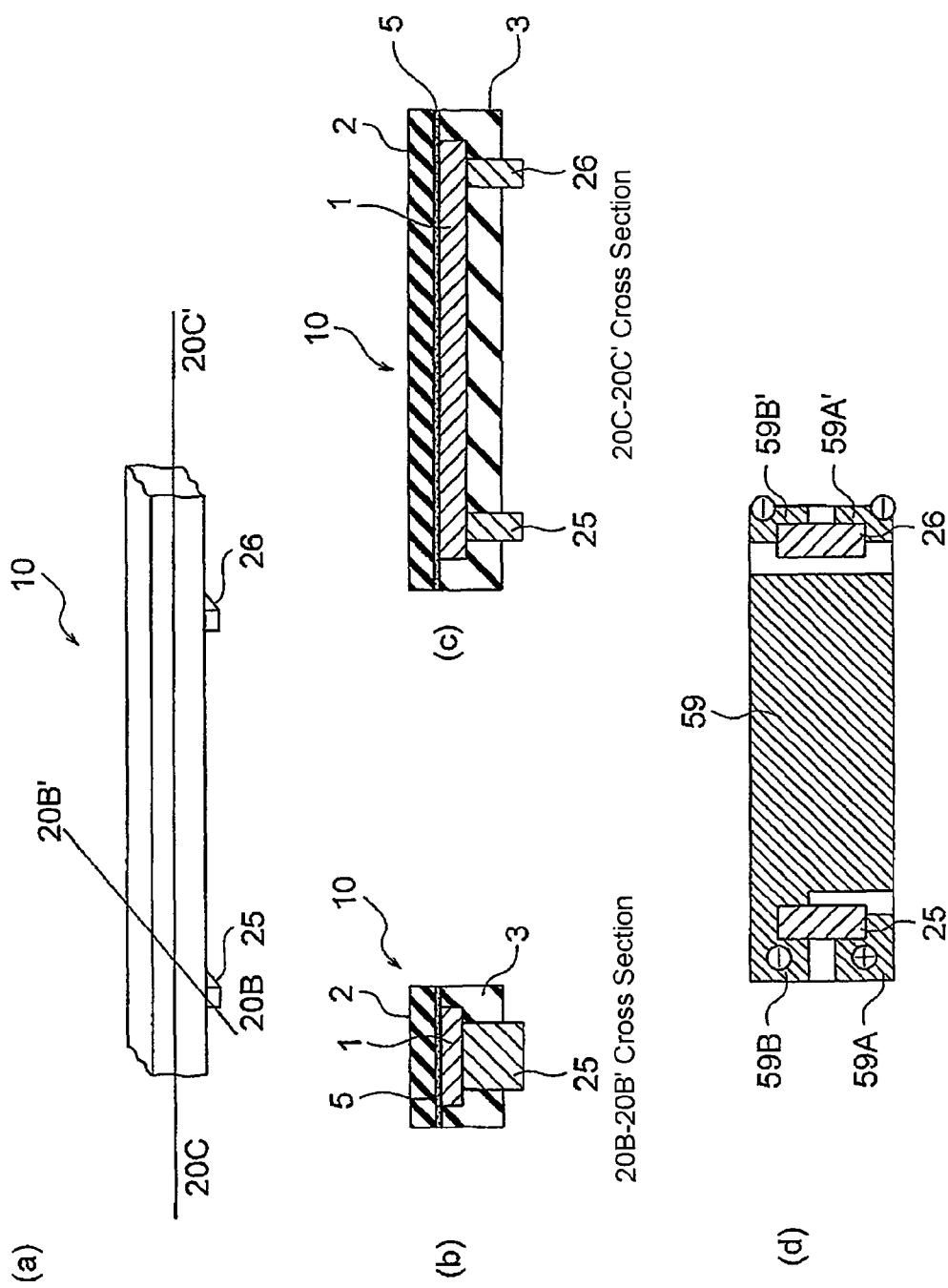
FIG. 20 includes (a) which is a perspective view showing a modification of the piezoelectric vibration module according to the second embodiment of this invention, (b) which is a cross-sectional view taken along line 20B-20B' of FIG. 20(a), (c) which is a cross-sectional view taken along line 20C-20C' of FIGS. 20(a), and (d) which is a plan view showing a state of connection of conductive members.
Figure 21:
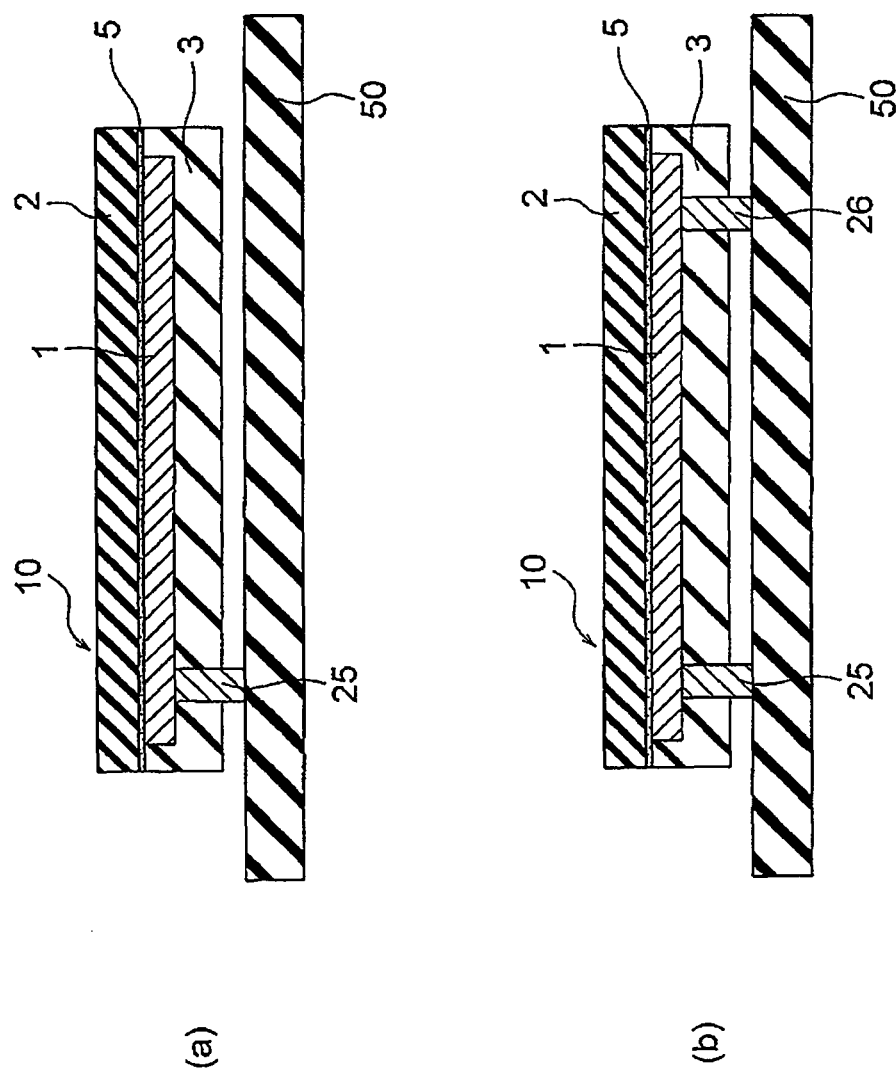
FIG. 21 includes (a) which is a cross-sectional view showing a mounting state of the piezoelectric vibration module, according to the second embodiment shown in FIG. 13(a), FIG. 13(b), and FIG. 13(c), on a drive circuit board and (b) which is a cross-sectional view showing a mounting state of the piezoelectric vibration module of FIG. 20(a), according to the modification of the second embodiment, on a drive circuit board.

FIG. 21(a) is a cross-sectional view showing a mounting state of the piezoelectric vibration module, according to the second embodiment shown in FIG. 13(a), FIG. 13(b), and FIG. 13(c), on a drive circuit board and FIG. 21(b) is a cross-sectional view showing a mounting state of the piezoelectric vibration module of FIG. 20(a), according to the modification of the second embodiment, on the drive circuit board.

As shown in FIG. 21(a) and FIG. 21(b), the piezoelectric vibration modules 10 according to the second embodiment and its modification are each mounted on a drive circuit board 50 through a protruding portion or protruding portions of the conductive member 25 or the conductive members 25 and 26 made of the conductive rubber.

Figure 22:
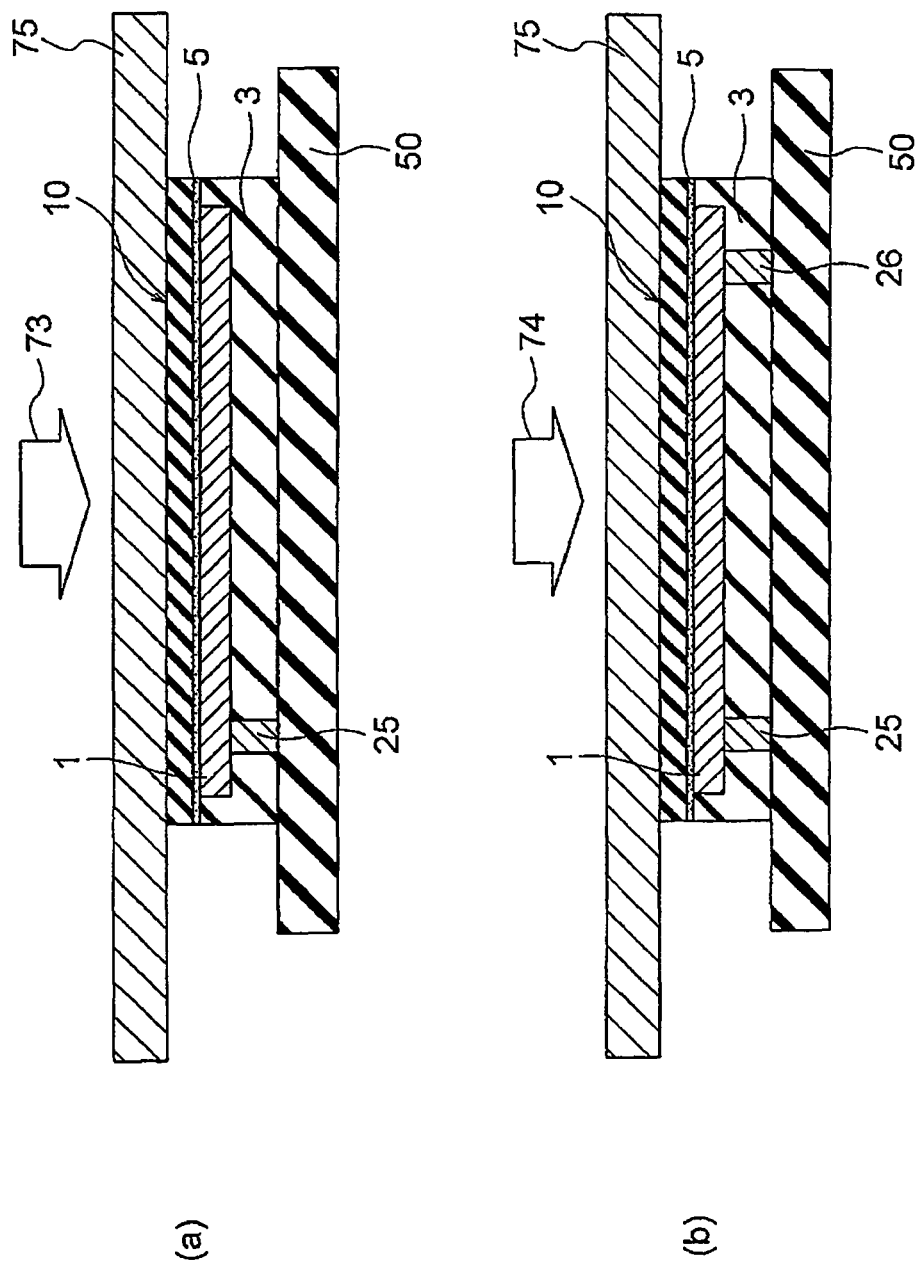
FIG. 22 includes (a) which is a cross-sectional view showing a method of mounting the piezoelectric vibration module of FIG. 21(a), according to the second embodiment, on the drive circuit board and (b) which is a cross-sectional view showing a method of mounting the piezoelectric vibration module of FIG. 22(a), according to the modification of the second embodiment, on the drive circuit board.

FIG. 22(a) is a cross-sectional view showing a method of mounting the piezoelectric vibration module of FIG. 21(a), according to the second embodiment, on the drive circuit board and FIG. 22(b) is a cross-sectional view showing a method of mounting the piezoelectric vibration module of FIG. 21(b), according to the modification of the second embodiment, on the drive circuit board.

As shown in FIG. 22(a) and FIG. 22(b), the piezoelectric vibration modules 10 according to the second embodiment and its modification are each pressed by a housing 75 as indicated by an arrow 73 or 74 so that the protruding portion or the protruding portions of the conductive member 25 or the conductive members 25 and 26 made of the conductive rubber are squeezed by 10 to 50%. Consequently, each piezoelectric vibration module 10 is electrically connected to the drive circuit board 50 and received in the housing 75 so as to be mounted.

FIG. 23(a) is a perspective view showing a piezoelectric vibration module according to a third embodiment of this invention, FIG. 23(b) is a cross-sectional view taken along line 23B-23B' of the piezoelectric vibration module of FIG. 23(a), FIG. 23(c) is a cross-sectional view taken along line 23C-23C' of the piezoelectric vibration module of FIG. 23(a), and FIG. 23(d) is a cross-sectional view taken along line 23C-23C', at the same position as FIG. 23(c), of a piezoelectric vibration module according to a modification of the piezoelectric vibration module according to the third embodiment of FIG. 23(a).

The piezoelectric vibration module according to the third embodiment shown in FIG. 23(a), FIG. 23(b), and FIG. 23(c) differs from the piezoelectric vibration module according to the first embodiment shown in FIG. 1(a), FIG. 1(b), and FIG. 1(c) in that a sound pressure adjusting means is provided.

That is, as shown in FIG. 23(a), FIG. 23(b), and FIG. 23(c), a piezoelectric vibration module 10 comprises a rectangular piezoelectric element 1, a flexible wiring (FPC) board 4 as a lead-out wiring member 4 connected to one surface of the piezoelectric element 1, an elastic plate 2 bonded to the other surface of the piezoelectric element 1 through an adhesive 5, and a housing member 3 covering the piezoelectric element jointly with the elastic plate 2.

The piezoelectric element 1, like that shown in FIG. 2 and FIG. 3, is formed by alternately laminating piezoelectric body layers 21, 22, and 23 each in the form of a rectangular piezoelectric ceramic plate and electrode layers 11, 12, 13, and 14 each in the form of a conductor film and further by forming first and second side electrodes 15 and 16 respectively on both end faces in a second direction crossing a lamination direction (first direction).

In the third embodiment of this invention, as in the first embodiment of this invention, the piezoelectric ceramic plates of a PZT-based material are used as the piezoelectric body layers 21, 22, and 23. However, naturally, any material may be used as long as it is a material having a piezoelectric effect.

The elastic plate 2 is made of a silicone rubber having a durometer hardness defined by JIS K 623 of 30 to 130 in order to achieve an improvement in temperature stability characteristics and an improvement in vibration displacement and having a thickness of 0.1 to 0.9 mm in order to achieve both an increase in vibration displacement and the drop impact resistance.

The flexible wiring board (FPC board) 4 as the wiring member 4 is provided on the surface, near its end, of the piezoelectric element 1.

Figure 7:
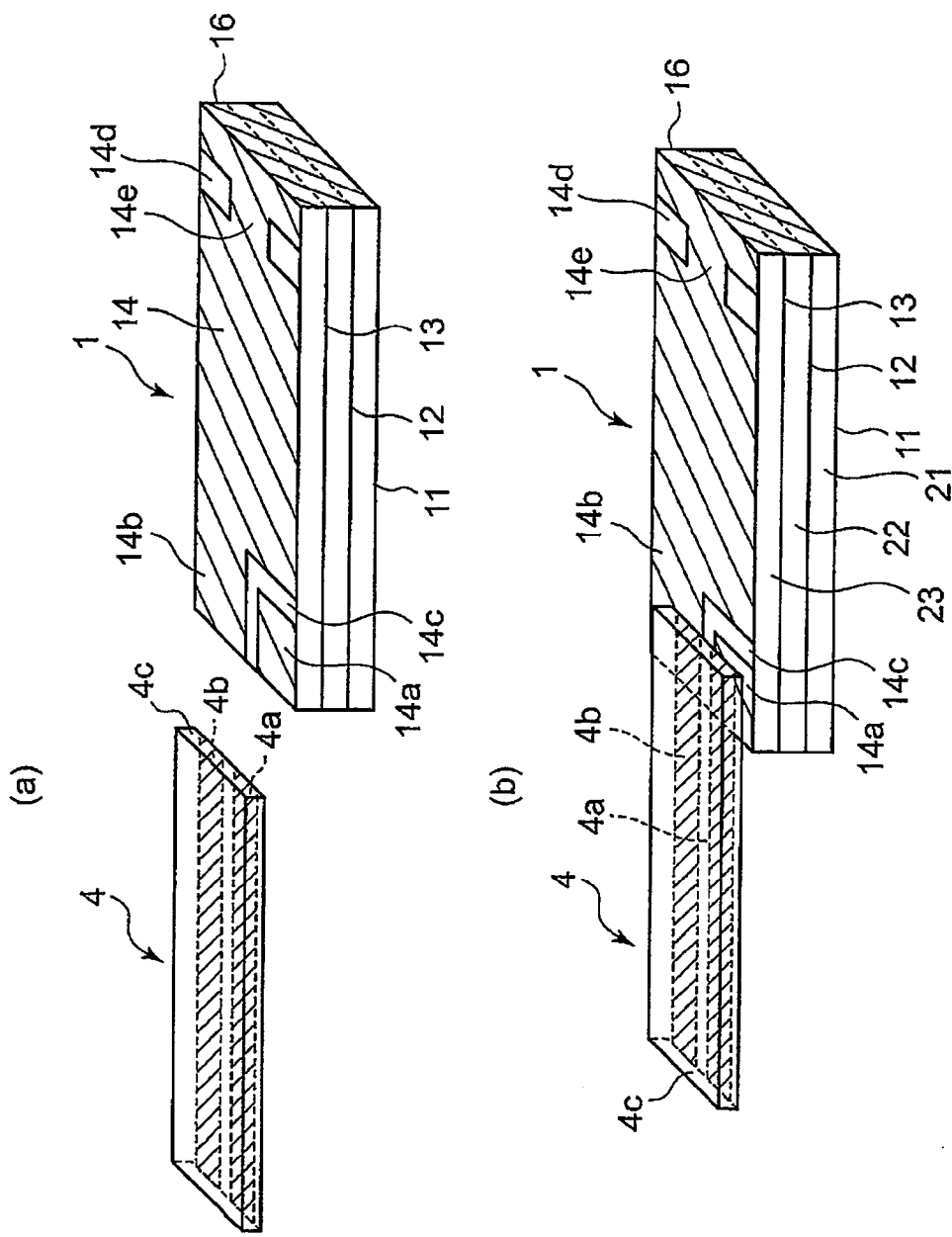
FIG. 7 includes (a) which is a perspective view showing a process of attaching an FPC board to the piezoelectric element, wherein a state before the attachment is shown, and (b) which is a perspective view showing the process of attaching the FPC board to the piezoelectric element, wherein a state after the attachment is shown.

The FPC board 4, like that shown in FIG. 7(*a*), is configured such that conductor patterns 4*a* and 4*b* are formed in parallel to each other on both sides of a longitudinal direction of one surface (back surface in the figure) of a flexible base member 4*c*.

The elastic plate 2, like that shown in FIG. 2, is bonded to the surface, on the side opposite to and facing the surface on which the FPC board 4 is provided, of the piezoelectric element 1 through the adhesive 5 such as a cold-setting adhesive or silicone-based double-sided tape. Preferably, the hardness of the adhesive 5 is equal to or less than that of the elastic plate 2.

As in the example of FIG. 2, the elastic plate 2 is used by being bonded to a diaphragm 6 of a touch panel. However, it can also be used as a speaker of a smartphone or the like or it can also generate low-frequency vibration of a vibrator or the like other than in the audible range.

The above is the same as the first embodiment.

Figure 23:
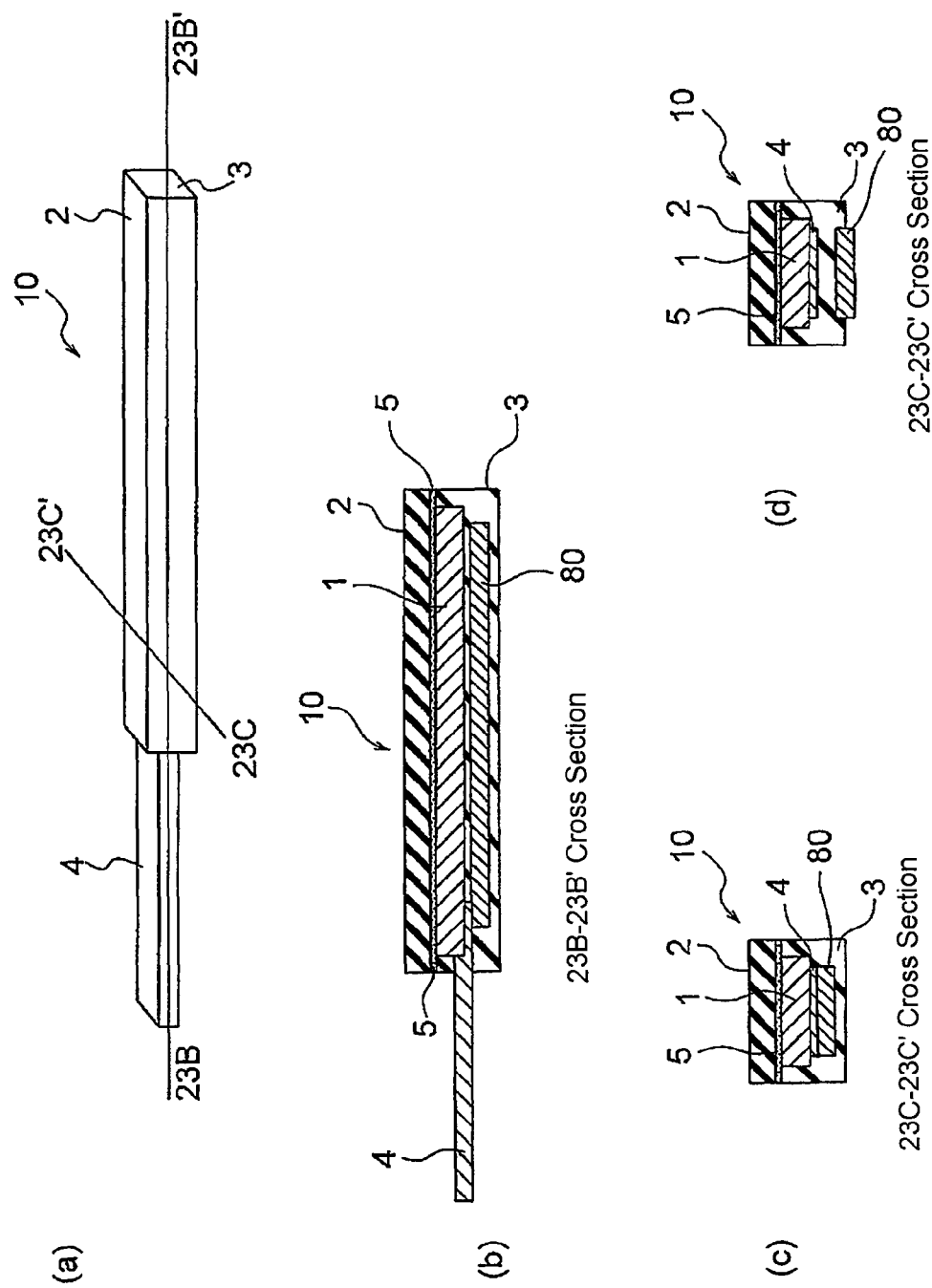
FIG. 23 includes (a) which is a perspective view showing a piezoelectric vibration module according to a third embodiment of this invention, (b) which is a cross-sectional view taken along line 23B-23B' of the piezoelectric vibration module of FIG. 23(a), (c) which is a cross-sectional view taken along line 23C-23C' of the piezoelectric vibration module of FIGS. 23(a), and (d) which is a cross-sectional view taken along line 23C-23C', at the same position as FIG. 23(c), of a piezoelectric vibration module according to a modification of the piezoelectric vibration module according to the third embodiment of FIG. 23(a).

As shown in FIG. 23(*a*), FIG. 23(*b*), and FIG. 23(*c*), the piezoelectric vibration module 10 according to the third embodiment of this invention differs from the piezoelectric vibration module according to the first embodiment in having a compositing member 80 embedded in the housing member 3 and forming a housing composite member. The compositing member 80 functions as a sound pressure adjusting means for flattening the sound pressure frequency characteristics.

As in the modification shown in FIG. 23(*d*), a compositing member 80 may of course be provided so that its surface is exposed from a housing member 3.

Figure 25:
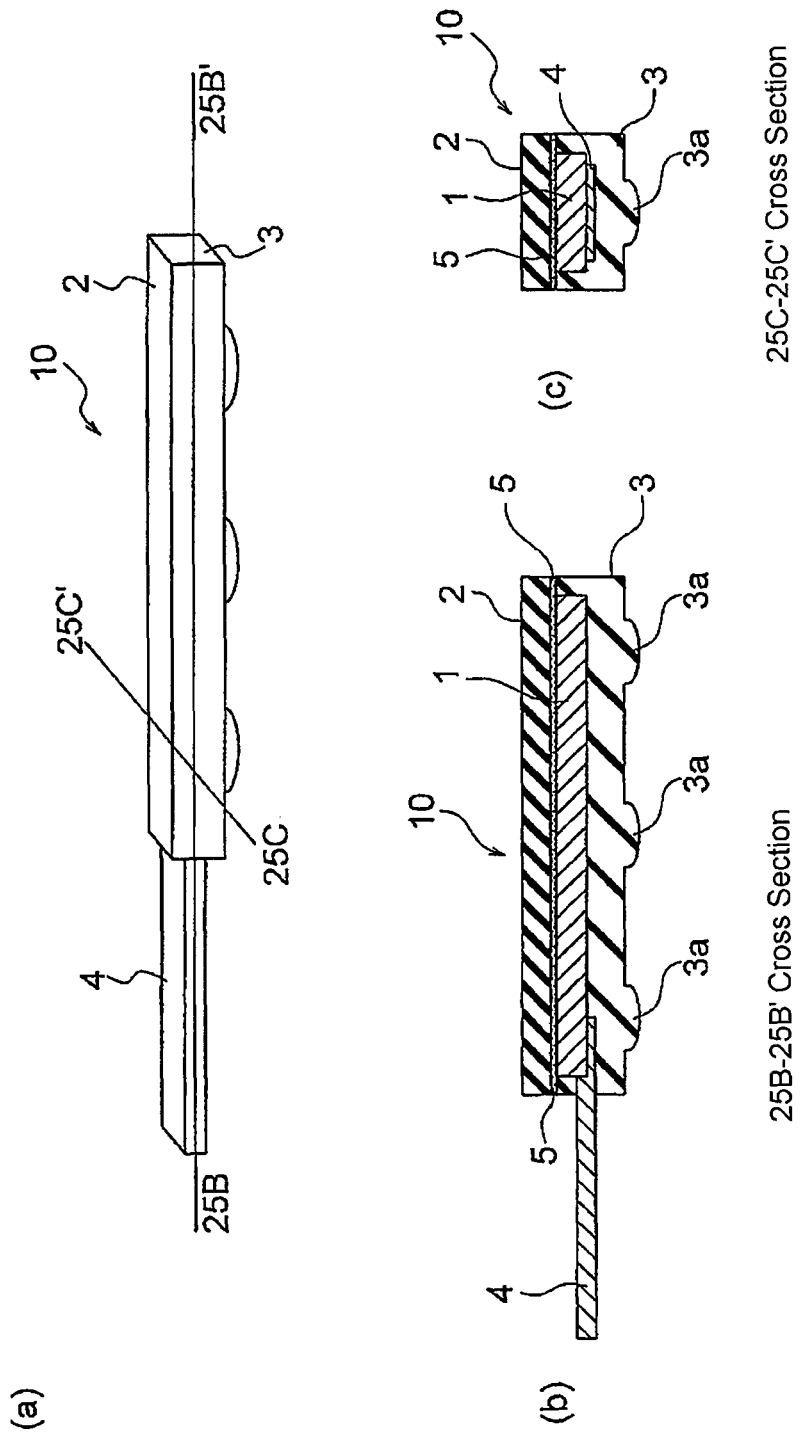
FIG. 25 includes (a) which is a perspective view showing a piezoelectric vibration module according to a fourth embodiment of this invention, (b) which is a cross-sectional view taken along line 25B-25B' of the piezoelectric vibration module of FIGS. 25(a), and (c) which is a cross-sectional view taken along line 25C-25C' of the piezoelectric vibration module of FIG. 25(a).

FIG. 25(*a*) is a perspective view showing a piezoelectric vibration module according to a fourth embodiment of this invention, FIG. 25(*b*) is a cross-sectional view taken along line 25B-25B' of the piezoelectric vibration module of FIG. 25(*a*), and FIG. 25(*c*) is a cross-sectional view taken along line 25C-25C' of the piezoelectric vibration module of FIG. 25(*a*).

The piezoelectric vibration module according to the fourth embodiment shown in FIG. 25(*a*), FIG. 25(*b*), and FIG. 25(*c*) differs from the piezoelectric vibration module according to the first embodiment shown in FIG. 1(*a*), FIG. 1(*b*), and FIG. 1(*c*) in that a sound pressure adjusting means is provided. The sound pressure adjusting means comprises three protruding portions 3*a* protruding from a surface of a housing member 3 and arranged side by side in a row at an interval therebetween. These protruding portions 3*a* serve to flatten the surface vibration distribution and are provided at portions corresponding to the nodes of the resonance mode of a glass panel. This makes it possible to avoid resonance with the glass panel which otherwise degrades the sound quality of a speaker or the like.

In the second, third, and fourth embodiments of this invention described above, as in the first embodiment, the piezoelectric vibration module is configured such that the piezoelectric element is covered with the elastic plate 2 and the housing member 3. However, if an elastic material such as a silicone rubber is used, the piezoelectric vibration module may of course be integrally formed by molding.

EXAMPLES

Next, various characteristics of the piezoelectric vibration modules according to the embodiments of this invention will be described.

Example 1

There were prepared a piezoelectric element 1 and a piezoelectric vibration module 10 having the structures shown in FIG. 1(*a*), FIG. 1(*b*), and FIG. 1(*c*). A silicone rubber was used as an elastic plate 2 and a housing member 3 for a piezoelectric element of a piezoelectric vibration module according to an Example of this invention.

The piezoelectric vibration module according to the Example of this invention had a length of 30 mm, a thickness of 1.8 mm, and a width of 3.0 mm while the piezoelectric element 1 had a length of 27 mm, a thickness of 1.0 mm, and a width of 5.0 mm.

For comparison, use was made of a piezoelectric vibration module having the same size and molded with polyurethane as an elastic plate and a housing member.

Using a function generator and a high-frequency amplifier and inputting a driving voltage of 20 Vpp and 300 to 3400 Hz, a displacement was measured by a laser displacement gauge.

The piezoelectric vibration module according to the embodiment of this invention and the piezoelectric vibration module according to the Comparative Example were placed in a thermostat and the temperature characteristics of the displacement and the temperature characteristics of the displacement change rate were examined by changing the temperature from −40° C. to 100° C. The results are shown in FIG. 9(*a*) and FIG. 9(*b*).

Figure 9:
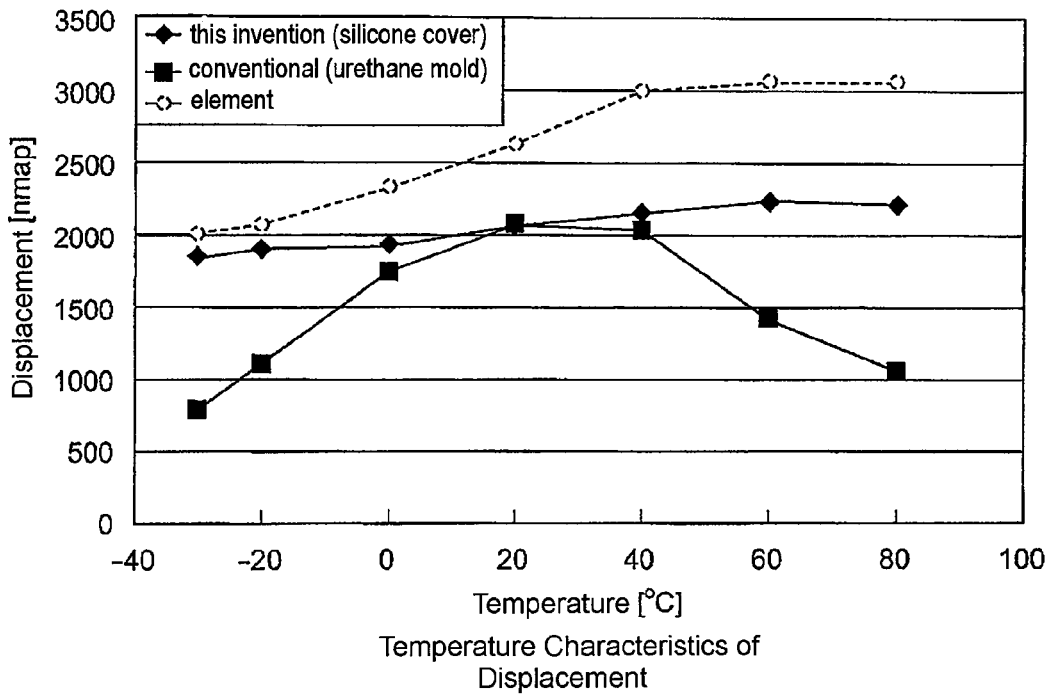
FIG. 9 includes (a) which is a diagram showing the temperature characteristics of the displacement of a piezoelectric vibration module according to Example 1 of this invention and (b) which is a diagram showing the temperature characteristics of the displacement change rate of the piezoelectric vibration module according to Example 1 of this invention.
Figure 9:
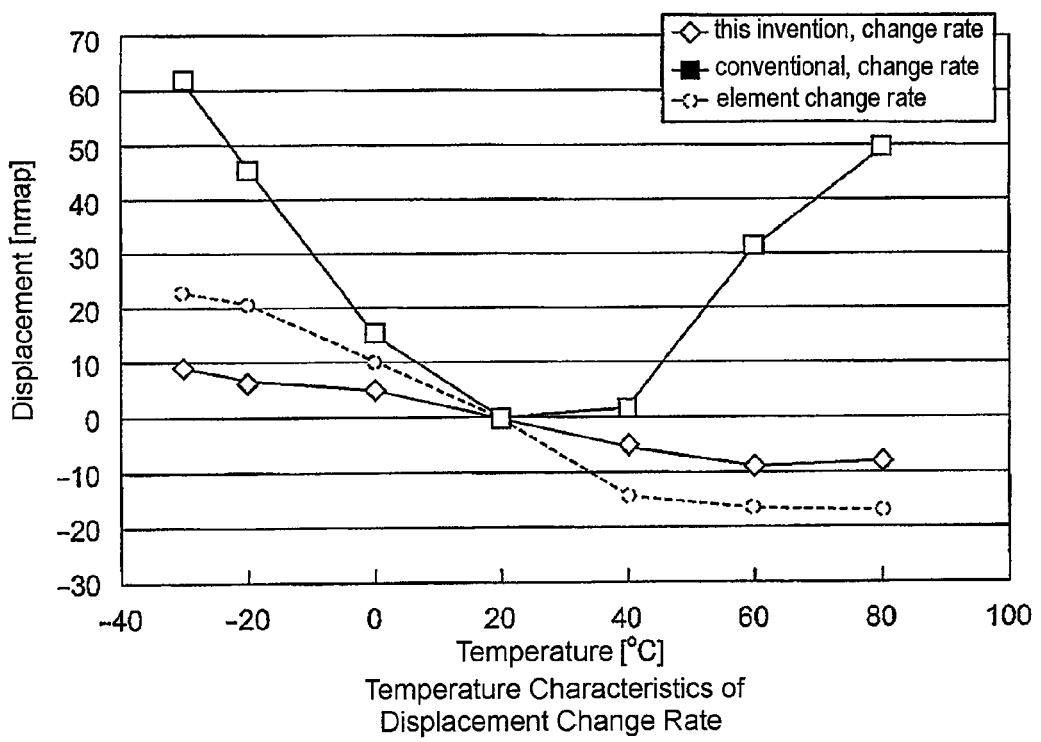

As shown in FIG. 9(*a*), it was confirmed that the displacement (peak-to-peak displacement amplitude in unit of nm, hereinafter referred to as nmpp) was in a range of 1700 to 2400 between −30 and 80° C. and that the change in displacement was clearly less compared to the element and the Comparative Example.

As shown in FIG. 9(*b*), it was confirmed that the displacement change rate (nmpp) was in a range of 10 to −8 between −30 and 80° C. and that the displacement change rate was clearly less compared to the element and the Comparative Example.

Example 2

Figure 10:
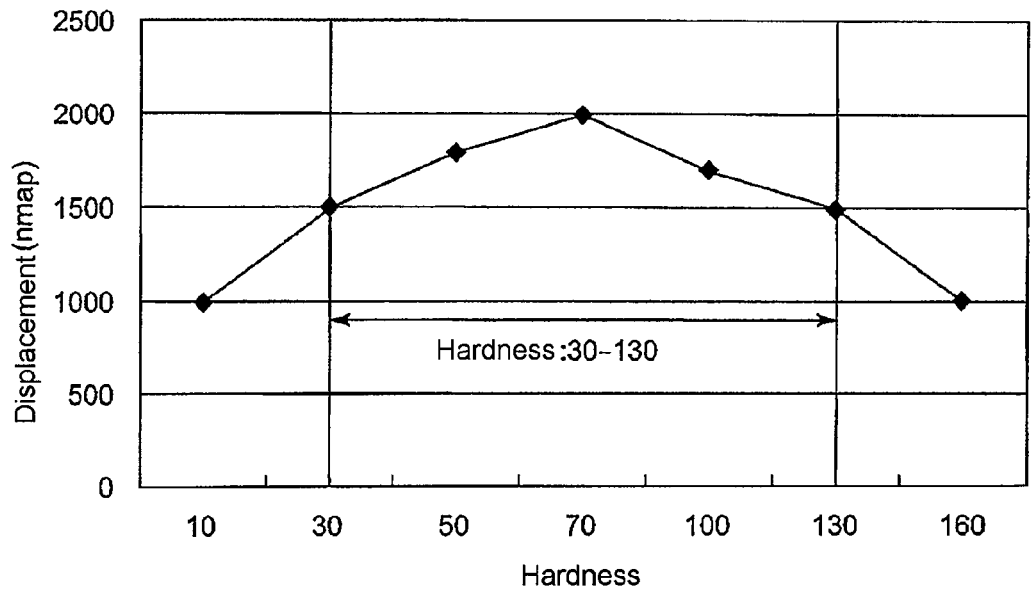
FIG. 10 is a diagram showing the temperature characteristics by the hardness of a silicone rubber of a piezoelectric vibration module according to Example 2 of this invention.

For piezoelectric vibration modules of this invention which were the same as that used in Example 1, the displacement with respect to the hardness was measured at room temperature using the same displacement gauge as in Example 1 by changing the durometer hardness (JIS K 6253) of a silicone rubber of a housing member and an elastic plate of each piezoelectric vibration module from 10 to 16. The results are shown in FIG. 10. As shown in FIG. 10, it was confirmed that the displacement (nmpp) showed an optimum value of 1500 to 2000 when the hardness of the silicone rubber was 30 to 130. By setting the durometer hardness to 30 to 130, it is possible to increase the magnitude of the vibration displacement.

Example 3

Using piezoelectric vibration modules having the same structure as that used in Example 1, with silicone rubber thicknesses (one-side thicknesses) different from that in Example 1 and with the same silicone rubber thickness, the displacement with respect to the silicone rubber thickness (one-side thickness) was measured at room temperature by the same displacement measurement as in Example 1. Further, the piezoelectric vibration modules of this invention were dropped by changing the height, thereby measuring the allowable drop height based on the presence/absence of damage, crack, chipping, or the like of piezoelectric elements.

Figure 11:
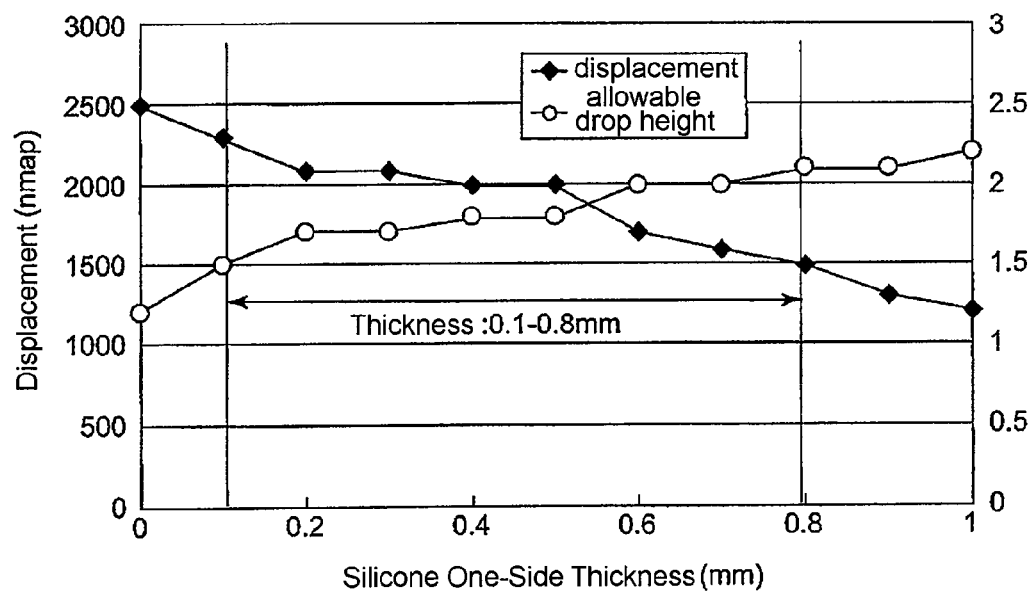
FIG. 11 is a diagram showing the relationship between the thickness of a silicone rubber having a hardness of 70 and the displacement of a piezoelectric vibration module according to Example 3 of this invention.

The results are shown in FIG. 11. As shown in FIG. 11, it was confirmed that, in a range of a thickness of 0.1 to 0.8 mm, the displacement (nmpp) was in a range of 1500 to 2300 and the allowable drop height was 1.5 m to 2.2 m. From this, it is possible to achieve both the vibration displacement and the drop impact resistance by setting the one-side thickness of the silicone rubber to 0.1 to 0.8 mm.

Example 4

Figure 13:
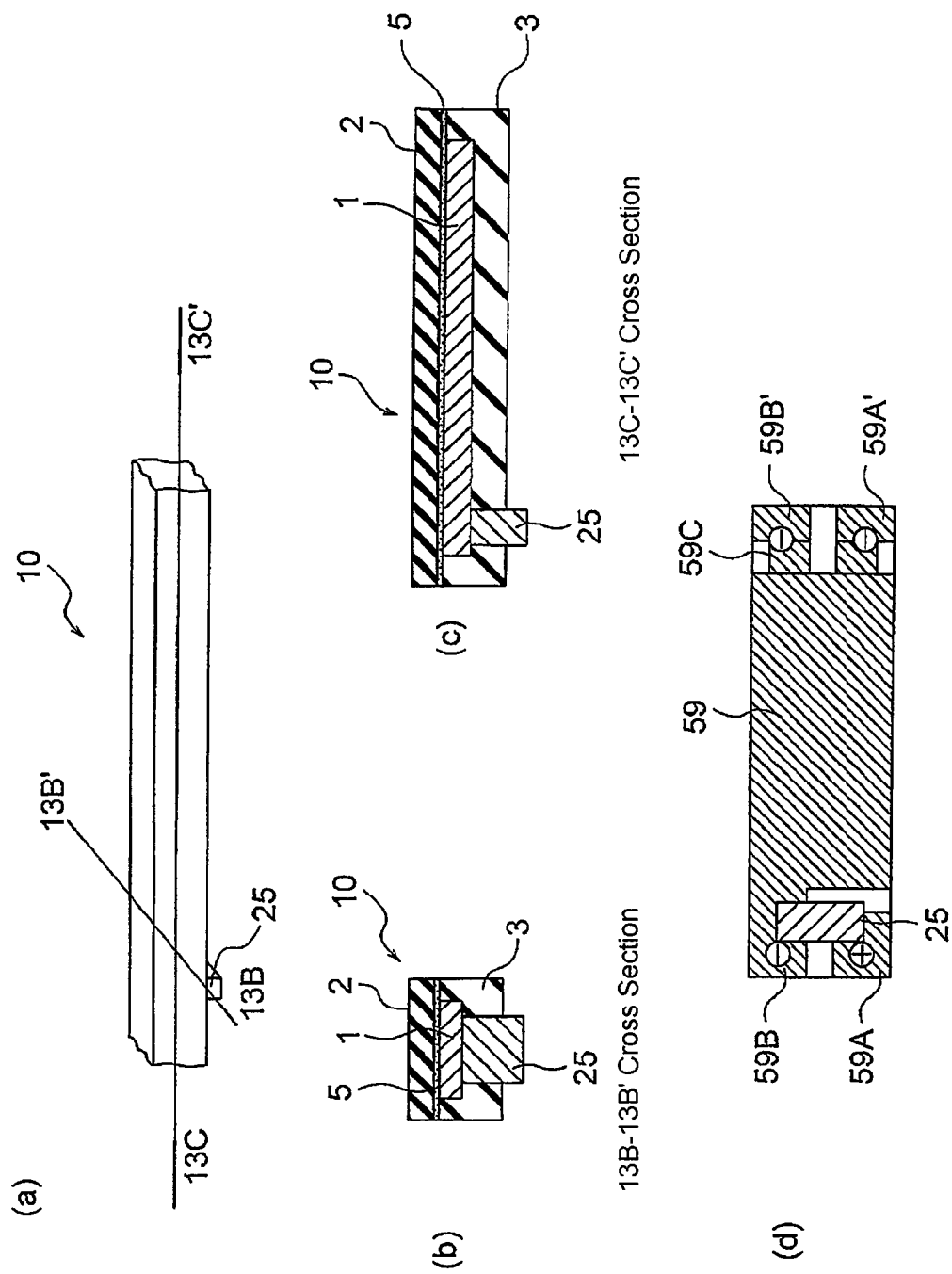
FIG. 13 includes (a) which is a perspective view showing a piezoelectric vibration module according to an embodiment of this invention, (b) which is a cross-sectional view taken along line 13B-13B' of (a), (c) which is a cross-sectional view taken along line 13C-13C' of (a), and (d) which is a plan view showing a state of connection of a piezoelectric element to a conductive member 25.
Figure 19:
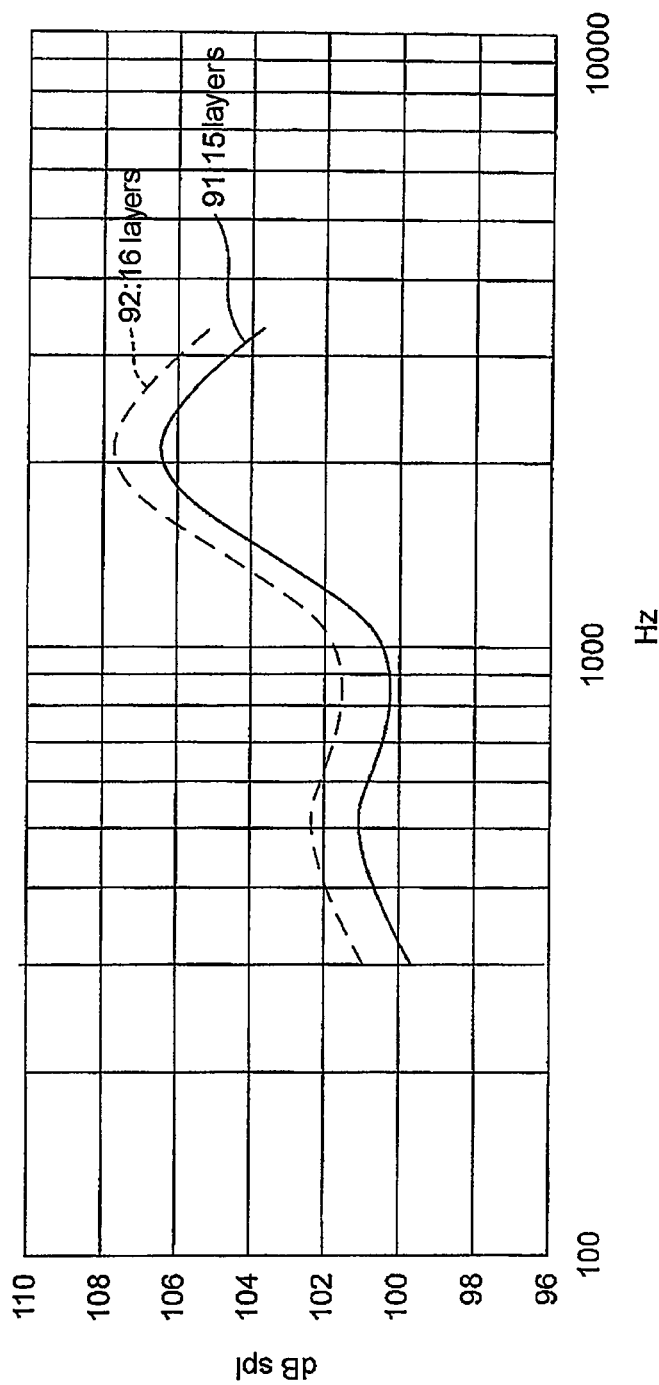
FIG. 19 is a diagram showing the sound pressure frequency characteristics of a piezoelectric element with laminated piezoelectric body layers (16 layers) according to Example 4 of this invention and a piezoelectric element with laminated piezoelectric body layers (15 layers) according to a Comparative Example.

There were manufactured a piezoelectric vibration module according to this invention which was a piezoelectric vibration module 10 shown in FIG. 13 or FIG. 20 and in which uppermost and lowermost planar electrode layers and intermediate planar electrode layers were formed as shown in FIG. 14 so that 16 piezoelectric element portions each having a piezoelectric body layer were laminated, and a piezoelectric vibration module according to a Comparative Example in which 15 ordinary piezoelectric element portions each having a piezoelectric body layer were laminated. Then, the sound pressure frequency characteristics thereof were examined. In the piezoelectric vibration module according to Example 4 of this invention, a piezoelectric element had a width of 2.4 mm, a length of 27 mm, and a thickness of 1.0 mm. The results are shown in FIG. 19. In FIG. 19, the abscissa axis represents the driving voltage frequency (Hz) and the ordinate axis represents the sound pressure (dBspl). As shown in FIG. 19, it is seen that the sound pressure was higher in the case of the piezoelectric vibration module according to this invention indicated by a curve 92 wherein the 16 piezoelectric element portions (piezoelectric body layers) were laminated, than in the case of the piezoelectric vibration module according to the Comparative Example indicated by a curve 91 wherein the 15 piezoelectric element portions (piezoelectric body layers) were laminated.

Example 5

Figure 24:
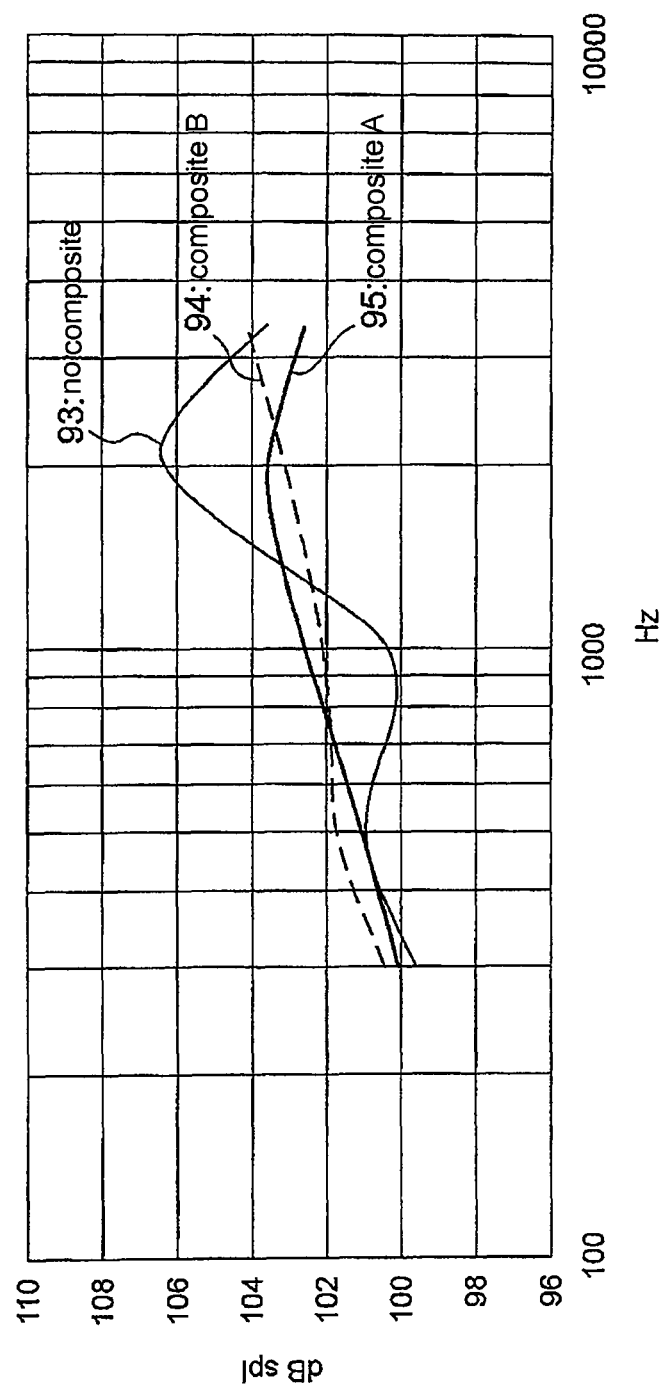
FIG. 24 is a diagram showing the effect of a compositing member added to a housing member of a piezoelectric vibration module according to Example 4 of this invention.

A compositing plate member A made of stainless SUS304 and having a thickness of 50 μm and a compositing plate member B made of PET (polyethylene terephthalate) and having a thickness of 200 μm were each used as a compositing member of a housing member shown in FIG. 23(A), (b), and (c) and were respectively integrated with housing members, thereby manufacturing piezoelectric vibration modules. For comparison, a piezoelectric vibration module according to the first embodiment shown in FIG. 1(a), FIG. 1(b), and FIG. 1(c) was manufactured. A piezoelectric element had a width of 2.4 mm, a length of 27 mm, and a thickness of 1.0 mm, and an elastic plate and the housing member had a thickness of 1.8 mm, a width of 2.4 mm, and a length of 30 mm. The sound pressure frequency dependence of these piezoelectric vibration modules was examined. The results are shown in FIG. 24. In FIG. 24, the abscissa axis represents the driving frequency (Hz) and the ordinate axis represents the sound pressure (dBspl). As shown in FIG. 24, it is seen that the sound pressure of the piezoelectric vibration module according to the first embodiment indicated by a curve 93 was significantly changed with respect to the frequency, while the sound pressure frequency characteristics of both piezoelectric vibration modules using the compositing members A and B of this invention were flattened as indicated by curves 95 and 94. This was because the resonance of the piezoelectric element and the resonance of a mounting member to which the piezoelectric element was attached were canceled each other by the composited plate member.

Example 6

In order to avoid resonant vibration of a glass plate 81, a piezoelectric vibration module shown in FIG. 25(a), FIG. 25(b), and FIG. 25(c) was attached to the glass plate 81 so that protruding portions 3a were located at the nodes of resonance of the glass plate 81 or nearby. Then, the vibration distribution was examined. A piezoelectric element had a width of 2.4 mm, a length of 27 mm, and a thickness of 1.0 mm, and a casing member, comprising a housing member and an elastic plate, of the piezoelectric vibration module had a length of 30 mm, a width of 3.0 mm, and a thickness of 1.8 mm.

Figure 26:
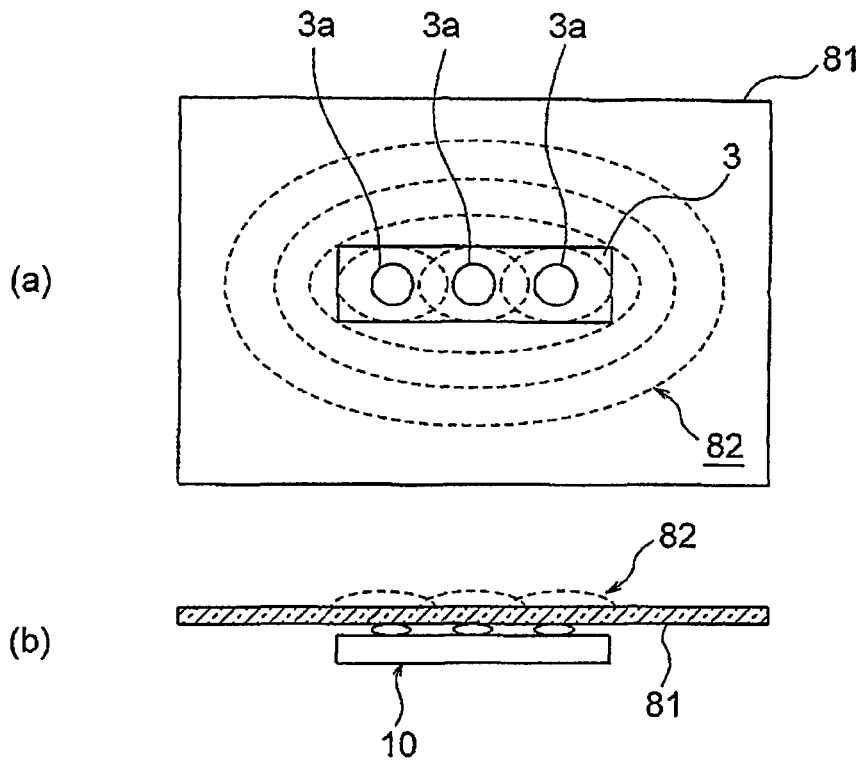
FIG. 26 includes (a) which is a plan view showing the operation and effect of protruding portions of a piezoelectric vibration module according to Example 5 of this invention on the vibration distribution (horizontal distribution) and (b) which is a front view showing the operation and effect of the protruding portions of the piezoelectric vibration module according to Example 5 of this invention on the vibration distribution (vertical distribution).

FIG. 26(a) is a plan view obtained by placing the glass plate on the protruding portion side of the piezoelectric vibration module shown in FIG. 25(a) and then examining the planar distribution of the vibration thereof, and FIG. 26(b) is a front view obtained by placing the glass plate on the protruding portion side of the piezoelectric vibration module shown in FIG. 25(a) and then examining the vertical distribution of the vibration thereof. For comparison, FIG. 27(a) is a plan view obtained by placing a glass plate on a piezoelectric vibration module shown in FIG. 1(a) and then examining the planar distribution of the vibration thereof, and FIG. 27(b) is a front view obtained by placing the glass plate on the protruding portion side of the piezoelectric vibration module shown in FIG. 1(a) and then examining the vertical distribution of the vibration thereof.

Figure 27:
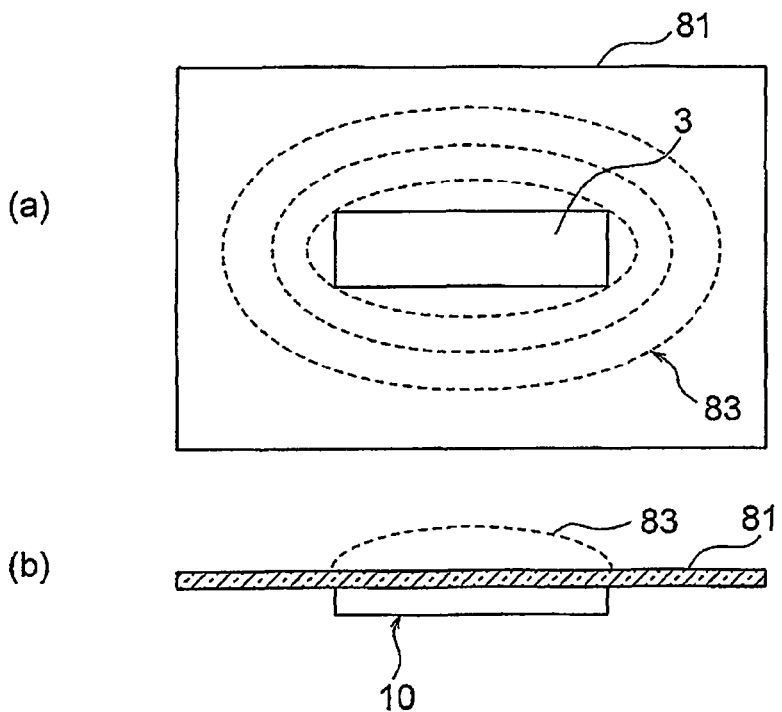
FIG. 27 includes (a) which is a plan view showing the operation and effect of a piezoelectric vibration module according to a prior art and (b) is a front view showing the operation and effect of the piezoelectric vibration module according to the prior art.

In comparison between FIG. 26(a) and FIG. 27(a), it is seen that a planar distribution 82 of vibration with the protruding portions 3a according to this invention is greater in change than a planar distribution 83 of vibration with no protruding portion. Further, in comparison between FIG. 26(b) and FIG. 27(b), it is seen that a vertical distribution 82 of vibration with the protruding portions 3a according to this invention is greater in change than a vertical distribution 83 of vibration with no protruding portion according to the Comparative Example.

It is obvious that if the protruding portions 3a are located at the antinodes of vibration of the piezoelectric element, the propagation of vibration further increases so that the change in planar distribution of vibration and the change in vertical distribution of vibration further increase.

INDUSTRIAL APPLICABILITY

As described above, a piezoelectric vibration module of this invention is applied to a panel-acoustic piezoelectric vibration module of a mobile terminal, a touch panel in general, a game controller, a game machine, or the like.

This application claims priority based on Japanese Patent Application No. 2012-86278, filed on Apr. 5, 2012, the disclosure of which is incorporated herein in its entirety.

DESCRIPTION OF SYMBOLS 1, 30 piezoelectric element
2 elastic plate
3 housing member
3a protruding portion
4 wiring member (FPC board)
4a, 4b conductor pattern
4c flexible base member
5 adhesive
6 diaphragm
10 piezoelectric vibration module
11, 12, 13, 14 planar electrode layer
11a, 12a, 13a, 14a first electrode portion
11b, 12b, 13b, 14b second electrode portion
11c, 12c, 12d, 13c, 13d, 14c, 14d insulating portion
15 first side electrode
15a first external electrode
15b second external electrode
15c insulating portion
16 second side electrode
20, 40 laminate
21, 22, 23 piezoelectric body layer
25, 26 conductive member (conductive rubber)
41, 42, 43, 44, 45, 46, 47, 48 piezoelectric body layer
50 drive circuit board
51, 52, 53, 54, 55, 56, 57, 58, 59 planar electrode layer
51B', 53A', 55A', 57A' second lead-out electrode
52A, 54A, 56A, 58A, 59B first lead-out electrode
59A first terminal electrode
59A', 59B' second terminal electrode
61A, 61B first side electrode
61A', 61B' second side electrode
65a, 65b, 68a, 68b arrow indicating a polarization direction
66a, 67a, 69b arrow indicating a contraction direction
66b, 67b, 69a arrow indicating an expansion direction
66c, 66d, 67c, 67d, 69c, 69d, 70c, 70d arrow indicating a voltage application direction
73, 74 arrow indicating a pressure direction
75 housing
80 compositing member
81 glass panel
82, 83 vibration distribution

The invention claimed is:

1. A piezoelectric vibration module comprising a piezoelectric element, a wiring member connected to the piezoelectric element and drawn out to the outside, and an elastic plate attached to one surface of the piezoelectric element,
wherein the elastic plate is made of a silicone rubber,
wherein the piezoelectric element comprises a laminate in which piezoelectric body layers and electrode layers are alternately laminated, and a first and a second side electrode provided on both end faces or both side surfaces in a second direction crossing a first direction being a lamination direction of the laminate,
wherein each electrode layer comprises a first electrode portion and a second electrode portion electrically separated from the first electrode portion,
wherein the first side electrode comprises a first external electrode and a second external electrode which are disposed side by side in a third direction crossing the first and second directions,
wherein the first electrode portion of each electrode layer is connected to the first external electrode, and
wherein one end, in the second direction, of the second electrode portion of each electrode layer is connected to the second external electrode.

2. The piezoelectric vibration module according to claim 1, further comprising a housing member provided so as to cover, jointly with the elastic plate, the piezoelectric element and a connecting portion, with the piezoelectric element, of the wiring member, wherein the housing member is made of the same silicone rubber as the elastic plate.

3. The piezoelectric vibration module according to claim 1, having an electrode lead-out portion on the other surface, facing the one surface, of the piezoelectric element, wherein the wiring member is a flexible wiring board conductively connected to the electrode lead-out portion.

4. The piezoelectric vibration module according to claim 1, wherein the silicone rubber has a hardness of 30 to 130.

5. The piezoelectric vibration module according to claim 1, wherein the elastic plate and the piezoelectric element are bonded to each other through a cold-setting silicone adhesive.

6. The piezoelectric vibration module according to claim 1,
wherein the other end, in the second direction, of the second electrode portion of each of the electrode layers at both ends in the first direction is connected to the second side electrode, and
wherein the electrode layers and the first and second side electrodes are electrically connected so that a driving voltage can be applied between the first electrode portions and the second electrode portions using the second electrode portions of the electrode layers at both ends in the first direction as driving external electrodes and the first electrode portions of the intermediate electrode layers between both ends in the first direction as driving internal electrodes.

7. The piezoelectric vibration module according to claim 6, wherein the piezoelectric body layers at both ends in the first direction of the laminate are polarized in a direction along the lamination direction by application of a polarization voltage.

8. The piezoelectric vibration module according to claim 7, having a structure in which the piezoelectric body layers expand and contract along the second direction when the driving voltage is applied between the first electrode portions and the second electrode portions.

9. An electroacoustic transducer wherein the elastic plate of the piezoelectric vibration module according to claim 1 is bonded to a diaphragm.

10. A piezoelectric element comprising a laminate in which piezoelectric body layers and electrode layers are alternately laminated, and a first and a second side electrode provided on both end faces or both side surfaces in a second direction crossing a first direction being a lamination direction of the laminate,
wherein each electrode layer comprises a first electrode portion and a second electrode portion electrically separated from the first electrode portion,
wherein the first side electrode comprises a first external electrode and a second external electrode which are disposed side by side in a third direction crossing the first and second directions,
wherein the first electrode portion of each electrode layer is connected to the first external electrode, wherein one end, in the second direction, of the second electrode portion of each electrode layer is connected to the second external electrode, wherein the other end, in the second direction, of the second electrode portion of each of the electrode layers at both ends in the first direction is connected to the second side electrode, and wherein the electrode layers and the first and second side electrodes are electrically connected so that a driving voltage can be applied between the first electrode portions and the second electrode portions using the second electrode portions of the electrode layers at both ends in the first direction as driving external electrodes and the first electrode portions of the intermediate electrode layers between both ends in the first direction as driving internal electrodes.

11. The piezoelectric element according to claim 10, wherein the piezoelectric body layers at both ends in the first direction of the laminate are polarized in a direction along the lamination direction by application of a polarization voltage.

12. The piezoelectric element according to claim 11, having a structure in which the piezoelectric body layers expand and contract along the second direction when the driving voltage is applied between the first electrode portions and the second electrode portions.

13. A method of manufacturing a piezoelectric element, comprising:
a step of preparing a first piezoelectric body having three mutually insulated electrodes;
a step of preparing a second piezoelectric body having two mutually insulated electrodes;
a step of preparing at least one third piezoelectric body having three mutually insulated electrodes;
a step of forming a laminate in which
the third piezoelectric body is laminated between the first and second piezoelectric bodies, and
the three electrodes of the first piezoelectric body and the three electrodes of the third piezoelectric body are electrically connected to each other and two of the three electrodes of each of the first and third piezoelectric bodies and the two electrodes of the second piezoelectric body are electrically connected to each other;
a step of polarizing the first and second piezoelectric bodies using the three electrodes of the first piezoelectric body;
a step of electrically connecting one and another one of the three electrodes of the first piezoelectric body to each other and forming two mutually electrically insulated element electrodes; and
a step of connecting a terminal having conductor patterns which are electrically connected to the two element electrodes of the first piezoelectric body.

14. A method of manufacturing a piezoelectric vibration module, comprising connecting a flexible wiring board to the element electrodes of the piezoelectric element manufactured by the method of manufacturing a piezoelectric element according to claim 13 and attaching a vibration plate to a surface other than a surface where the element electrodes are formed.

15. A method of manufacturing an electroacoustic transducer, comprising, in addition to the method of manufacturing a piezoelectric vibration module according to claim 14, covering the piezoelectric element including a connecting portion of the flexible wiring board with a housing member.

16. A piezoelectric vibration module comprising:
a piezoelectric element,
a wiring member connected to the piezoelectric element and drawn out to the outside,
an elastic plate attached to one surface of the piezoelectric element,
a housing member provided so as to cover the piezoelectric element and a connecting portion, with the piezoelectric element, of the wiring member, and
a sound pressure adjusting means,
wherein the sound pressure adjusting means comprises a protruding portion provided so as to protrude from a surface of the housing member and wherein the protruding portion is provided at a portion corresponding to a node of resonance, excited by the piezoelectric vibration module, of a mounting member to which the piezoelectric vibration module is mounted.

17. The piezoelectric vibration module according to claim 16, having an electrode lead-out portion provided on the other surface, facing the one surface to which the elastic plate is attached, of the piezoelectric element, wherein the wiring member is one of a flexible wiring board and an elastic conductive member conductively connected to the electrode lead-out portion.

18. The piezoelectric vibration module according to claim 16, wherein the wiring member is the flexible wiring board and wherein the flexible wiring board passes through the housing member in a direction along the one surface or the other surface of the piezoelectric element from the electrode lead-out portion and is drawn out in a longitudinal direction of the piezoelectric element.

19. The piezoelectric vibration module according to claim 17, wherein the wiring member is the conductive member and wherein the conductive member passes through the housing member and protrudes in a direction crossing the other surface of the piezoelectric element from the electrode lead-out portion.

20. The piezoelectric vibration module according to claim 16, wherein the sound pressure adjusting means comprises a compositing member integrally provided with the housing member in parallel to the piezoelectric element and wherein the compositing member causes vibration of the piezoelectric element itself and vibration, excited by the piezoelectric vibration module, of a mounting member to be canceled each other.

21. The piezoelectric vibration module according to claim 17, comprising a laminate in which a plurality of piezoelectric element portions forming the piezoelectric element are laminated in a first direction, wherein the piezoelectric element portions have piezoelectric body layers, surface electrode layers formed on the piezoelectric body layers in a second direction crossing the first direction, and first and second lead-out electrodes formed at ends in the second direction of the piezoelectric body layers and connected to the surface electrode layers, wherein the first and second lead-out electrodes are drawn out from the surface electrode layers to the ends of the piezoelectric body layers corresponding to lamination positions of the laminate.

22. The piezoelectric vibration module according to claim 19, wherein the laminate comprises a bottom piezoelectric element portion located at a bottom portion and a uppermost piezoelectric element portion located at an uppermost portion and wherein a polarization direction of the uppermost piezoelectric element portion differs from a polarization direction of the other piezoelectric element portions including the bottom piezoelectric element portion.

23. The piezoelectric vibration module according to claim 22, wherein a piezoelectric body layer of the uppermost piezoelectric element portion and piezoelectric body layers, excluding a piezoelectric body layer of the bottom piezoelectric element portion, other than the uppermost piezoelectric element portion have electrode structures that excite expansion-contraction vibrations opposite to each other.

24. The piezoelectric vibration module according to claim 20, wherein the sound pressure adjusting means forms a piezoelectric bimorph structure that performs bending vibration determined by the lamination number of the piezoelectric element portions, polarization directions of the piezoelectric element portions, and a driving voltage application direction of the piezoelectric element portions.

25. The piezoelectric vibration module according to claim 20, wherein the number of the piezoelectric body layers is 2n (n is an integer of 1 or more).

26. An electroacoustic transducer comprising the piezoelectric vibration module according to claim 19, a drive circuit board, and a housing, wherein the housing holds the conductive member in pressure contact with the drive circuit board through the piezoelectric vibration module.

27. A mounting method of placing the piezoelectric vibration module according to claim 19 in a housing and mounting it, wherein the wiring member is the conductive member passing through the housing member and protruding to the outside and wherein the housing causes a protruding end of the conductive member of the piezoelectric vibration module to be in pressure contact with a drive circuit board.

28. A piezoelectric element comprising a laminate in which a plurality of piezoelectric element portions are laminated in a first direction, wherein the piezoelectric element portions have piezoelectric body layers, surface electrode layers formed on the piezoelectric body layers in a second direction crossing the first direction, and first and second lead-out electrodes formed at ends in the second direction of the piezoelectric body layers and connected to the surface electrode layers, wherein the first and second lead-out electrodes are drawn out from the surface electrode layers to the ends of the piezoelectric body layers corresponding to lamination positions of the piezoelectric element portions in the laminate.

29. The piezoelectric element according to claim 28, wherein the laminate comprises the bottom piezoelectric element portion located at a bottom portion and the uppermost piezoelectric element portion located at an uppermost portion and wherein a polarization direction of the uppermost piezoelectric element portion differs from a polarization direction of the other piezoelectric element portions including the bottom piezoelectric element portion.

30. The piezoelectric element according to claim 29, wherein a piezoelectric body layer of the uppermost piezoelectric element portion and piezoelectric body layers, excluding a piezoelectric body layer of the bottom piezoelectric element portion, other than the uppermost piezoelectric element portion have electrode structures that excite expansion-contraction vibrations opposite to each other.

31. The piezoelectric element according to claim 28, further comprising a sound pressure adjusting means, wherein the sound pressure adjusting means forms a piezoelectric bimorph structure that performs bending vibration determined by the lamination number of the piezoelectric element portions, polarization directions of the piezoelectric element portions, and a driving voltage application direction of the piezoelectric element portions.

32. The piezoelectric element according to claim 28, wherein the number of the piezoelectric body layers is 2n (n is an integer of 1 or more).

33. A method of manufacturing a piezoelectric element, comprising:
a step of preparing a plurality of piezoelectric element portions having piezoelectric body layers, surface electrode layers, and mutually different end electrode layers formed at ends; and
a step of forming a laminate by laminating the plurality of piezoelectric element portions in a first direction in order,
wherein, in the step of forming a laminate, the end electrode layers of the piezoelectric element portions are laminated so as to be drawn out to the end sides corresponding to lamination positions of the piezoelectric element portions in the laminate.

34. The method of manufacturing a piezoelectric element according to claim 33, wherein the laminate comprises the bottom piezoelectric element portion located at a bottom portion and the uppermost piezoelectric element portion located at an uppermost portion and wherein the method further comprises a step of performing polarization so that a polarization direction of the uppermost piezoelectric element portion differs from a polarization direction of the other piezoelectric element portions including the bottom piezoelectric element portion.

35. The method of manufacturing a piezoelectric element according to claim 34, wherein a piezoelectric body layer of the uppermost piezoelectric element portion and piezoelectric body layers, excluding a piezoelectric body layer of the bottom piezoelectric element portion, other than the uppermost piezoelectric element portion have electrode structures that excite expansion-contraction vibrations opposite to each other.

36. The method of manufacturing a piezoelectric element according to claim 33, further comprising a step of forming a sound pressure adjusting means, wherein the step of forming a sound pressure adjusting means forms a piezoelectric bimorph structure that performs bending vibration determined by the lamination number of the piezoelectric element portions, polarization directions of the piezoelectric element portions, and a driving voltage application direction of the piezoelectric element portions.

37. The method of manufacturing a piezoelectric element according to claim 33, comprising laminating 2n (n is an integer of 1 or more) piezoelectric body layers.

38. A method of manufacturing a piezoelectric vibration module, comprising:
in addition to the method of manufacturing a piezoelectric element according to claim 33,
a step of connecting a wiring member, for leading out to the outside, to the piezoelectric element;
a step of attaching an elastic plate to one surface of the piezoelectric element; and
a step of providing a housing member covering the piezoelectric element and a connecting portion, with the piezoelectric element, of the wiring member.

39. The method of manufacturing a piezoelectric vibration module according to claim 38, wherein the wiring member is a flexible wiring board or an elastic conductive member conductively connected to an electrode lead-out portion.

40. The method of manufacturing a piezoelectric vibration module according to claim 39, wherein the wiring member is the flexible wiring board and wherein the method comprises forming the flexible wiring board so that it passes through the housing member in a direction along the one surface or the other surface of the piezoelectric element from the electrode lead-out portion and is drawn out in a longitudinal direction of the piezoelectric element.

41. The method of manufacturing a piezoelectric vibration module according to claim 39, wherein the wiring member is the conductive member and wherein the method comprises forming the conductive member so that it passes through the housing member and protrudes in a direction crossing the other surface of the piezoelectric element from the electrode lead-out portion.

42. The method of manufacturing a piezoelectric vibration module according to claim 38, further comprising a step of forming a sound pressure adjusting means, wherein the step of forming a sound pressure adjusting means comprises forming a protruding portion protruding from a surface of the housing member.

43. The method of manufacturing a piezoelectric vibration module according to claim 38, further comprising a step of forming a sound pressure adjusting means, wherein the step of forming a sound pressure adjusting means comprises forming a compositing member integrally with the housing member in parallel to the piezoelectric element.

\* \* \* \* \*